(12) United States Patent
Nemecek et al.

(10) Patent No.: US 6,654,934 B1
(45) Date of Patent: Nov. 25, 2003

(54) PROGRAMMABLE EVENT ENGINE

(75) Inventors: Craig Nemecek, Seattle, WA (US); Steve Roe, Woodinville, WA (US)

(73) Assignee: Cyrpess Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/113,580

(22) Filed: Mar. 28, 2002

(51) Int. Cl.[7] .............................................. G06F 17/50
(52) U.S. Cl. ................................. 716/4; 716/5; 703/17
(58) Field of Search ........................... 716/1–6, 16–18; 703/13–17

(56) References Cited

U.S. PATENT DOCUMENTS 5,594,741 A * 1/1997 Kinzelman et al. ............. 716/4
6,466,898 B1 * 10/2002 Chan ........................... 703/17

* cited by examiner

*Primary Examiner*—Vuthe Siek
*Assistant Examiner*—Paul Dinh
(74) *Attorney, Agent, or Firm*—Wagner, Murabito & Hao LLP

(57) ABSTRACT

A device for executing an event thread. The device has programmable logic for storing data to define a number of states in an event thread to be executed in the event engine. The device also has execution logic coupled to the programmable logic. The execution logic is configurable to execute the current state and re-configurable to execute the next state, in response to data from the programmable logic. In this fashion, the next state may be executed by re-configuring the execution logic. The device also has transition logic coupled to the programmable logic. The transition logic causes the next state in the event thread to be entered by loading new data from the programmable logic. Therefore, the execution logic is re-configurable during execution of the event thread.

20 Claims, 26 Drawing Sheets

600

| BITS(S) | DATA WORD | DESCRIPTION |
|---|---|---|
| 31 | 0 | EVENT THREAD ENABLE |
| 30:25 | 0 | POINTER TO NEXT EVENT CELL |
| 24 | 0 | INVERT DECISION LOGIC OUTPUT |
| 23 | 0 | EXTERNAL TRIGGER |
| 22 | 0 | TRACE OFF |
| 21 | 0 | TRACE ON |
| 20 | 0 | BREAK |
| 19:16 | 0 | INPUT BUS SELECT<br>0 - PROGRAM COUNTER (PC)<br>1 - MICRO IO ADDRESS BUS (DA)<br>2 - MICRO MEM ADDRESS BUS (DA)<br>3 - MICRO IO DATA BUS (DB)<br>4 - MICRO MEM DATA BUS (DB)<br>5 - MICRO INSTRUCTION REGISTER (IR)<br>6 - EXTERNAL LOGIC PINS<br>7 - MICRO EXTRA REGISTER (X)<br>8 - MICRO ACCUMULATOR (A)<br>9 - STACK POINTER (SP)<br>a - IO DA AND IO DB<br>b - MEM DA AND MEM DB<br>c - EXTRA REGISTER AND ACCUMULATOR (X HIGH)<br>d - IR AND SP (IR HIGH) |
| 15:0 | 0 | COUNTER START VALUE |
| 31:16 | 1 | MAXIMUM VALUE FOR WORD COMPARE |
| 15:0 | 1 | MINIMUM VALUE FOR WORD COMPARE |

| BITS(S) | DATA WORD | DESCRIPTION |
|---|---|---|
| 31 | 0 | EVENT THREAD ENABLE |
| 30:25 | 0 | POINTER TO NEXT EVENT CELL |
| 24 | 0 | INVERT DECISION LOGIC OUTPUT |
| 23 | 0 | EXTERNAL TRIGGER |
| 22 | 0 | TRACE OFF |
| 21 | 0 | TRACE ON |
| 20 | 0 | BREAK |
| 19:16 | 0 | INPUT BUS SELECT<br>0 - BIT FIELD:<br>    7 - EXTENDED IO FLAG<br>    6 - CARRY FLAG<br>    5 - ZERO FLAG<br>    4 - GLOBAL INTERRUPT FLAG<br>    3 - IO WRITE FLAG<br>    2 - IO READ FLAG<br>    1 - MEMORY WRITE FLAG<br>    0 - MEMORY READ FLAG<br>1- MICRO IO ADDRESS BUS (DA)<br>2 - MICRO MEM ADDRESS BUS (DA)<br>3 - MICRO IO DATA BUS (DB)<br>4 - MICRO MEM DATA BUS (DB)<br>5 - MICRO INSTRUCTION REGISTER (IR)<br>6 - EXTERNAL LOGIC PINS<br>7 - MICRO EXTRA REGISTER (X)<br>8 - MICRO ACCUMULATOR (A)<br>9 - STACK POINTER (SP) |
| 15:0 | 0 | COUNTER START VALUE |
| 31:24 | 1 | RESERVED |
| 23:16 | 1 | MAXIMUM VALUE FOR RANGE COMPARE |
| 15:8 | 1 | BIT MASK |
| 7:0 | 1 | MINIMUM VALUE FOR RANGE COMPARE |

| BITS(S) | DATA WORD | DESCRIPTION |
|---|---|---|
| 31 | 0 | RESERVED |
| 30:24 | 0 | POINTER TO NEXT STATE FOR THIS CHAIN |
| 23:18 | 0 | RESERVED |
| 17 | 0 | ENABLE BIT |
| 16 | 0 | OUTPUT INVERT |
| 15 | 0 | EVENT THREAD 7 POSITIVE LOGIC ENABLE |
| 14 | 0 | EVENT THREAD 7 NEGATIVE LOGIC ENABLE |
| 13 | 0 | EVENT THREAD 6 POSITIVE LOGIC ENABLE |
| 12 | 0 | EVENT THREAD 6 NEGATIVE LOGIC ENABLE |
| 11 | 0 | EVENT THREAD 5 POSITIVE LOGIC ENABLE |
| 10 | 0 | EVENT THREAD 5 NEGATIVE LOGIC ENABLE |
| 9 | 0 | EVENT THREAD 4 POSITIVE LOGIC ENABLE |
| 8 | 0 | EVENT THREAD 4 NEGATIVE LOGIC ENABLE |
| 7 | 0 | EVENT THREAD 3 POSITIVE LOGIC ENABLE |
| 6 | 0 | EVENT THREAD 3 NEGATIVE LOGIC ENABLE |
| 5 | 0 | EVENT THREAD 2 POSITIVE LOGIC ENABLE |
| 4 | 0 | EVENT THREAD 2 NEGATIVE LOGIC ENABLE |
| 3 | 0 | EVENT THREAD 1 POSITIVE LOGIC ENABLE |
| 2 | 0 | EVENT THREAD 1 NEGATIVE LOGIC ENABLE |
| 1 | 0 | EVENT THREAD 0 POSITIVE LOGIC ENABLE |
| 0 | 0 | EVENT THREAD 0 NEGATIVE LOGIC ENABLE |

| FIELD | OR | AND | NOR | NAND |
|---|---|---|---|---|
| CHAIN ENABLE | 1 | 1 | 1 | 1 |
| INVERT OUTPUT | 1 | 0 | 0 | 1 |
| POSITIVE LOGIC ENABLE | 1 | 0 | 1 | 0 |
| NEGATIVE LOGIC ENABLE | 0 | 1 | 0 | 1 |

| FIELD | OR | AND | NOR | NAND |
|---|---|---|---|---|
| CHAIN ENABLE | 1 | 1 | 1 | 1 |
| INVERT OUTPUT | 1 | 0 | 0 | 1 |
| POSITIVE LOGIC ENABLE EVENT A | 0 | 0 | 1 | 0 |
| NEGATIVE LOGIC ENABLE EVENT A | 1 | 1 | 0 | 1 |
| POSITIVE LOGIC ENABLE EVENT B | 1 | 1 | 0 | 1 |
| NEGATIVE LOGIC ENABLE EVENT B | 0 | 0 | 1 | 0 |
| POSITIVE LOGIC ENABLE EVENT C | 1 | 0 | 1 | 1 |
| NEGATIVE LOGIC ENABLE EVENT C | 0 | 1 | 0 | 0 |

|  | $E_1$ 120a | $E_2$ 120b | $E_3$ 120c | $E_4$ 120d |
|---|---|---|---|---|
| $C_1$ 1110a | BE | BE | BE | 1 |
| $C_2$ 1110b | 1 | 1 | 1 | 1 |

← CHAIN OUTPUT SIGNAL 1125

1860

|  | $E_1$ | $E_2$ | $E_3$ | $E_4$ |
|---|---|---|---|---|
| $C_1$ | BE | BE | 1 | 1 |
| $C_2$ | 1 | 1 | BE | BE |

1870

|  | $E_1$ | $E_2$ | $E_3$ | $E_4$ |
|---|---|---|---|---|
| $C_1$ | 1 | 1 | 1 | 1 |
| $C_2$ | 1 | 1 | 1 | 1 |

FIGURE 18B

PROGRAMMABLE EVENT ENGINE

FIELD OF THE INVENTION

The present invention relates to the field of logic analyzers and emulators. Specifically, the present invention relates to a programmable event engine that is re-configurable to execute a number of states in an event thread.

BACKGROUND ART

Logic analyzers and in-circuit emulators have been used for many years by software and hardware developers to help diagnose and debug hardware and software. Such devices may be able to monitor and analyze various circuit and software conditions during debugging and testing of the design. For example, they may store trace information, such as time stamps, register values, data memory content, etc., which may be later analyzed. They may also provide various configurable breakpoints, which allow the designer to analyze the state of the design at a point in its operation by stopping operation when a specified condition occurs. The breakpoints may also be chained together such that a series of conditions happen before the operation is stopped.

For example, conventional logic analyzers and in-circuit-emulators may have a relatively small number of configurable complex breakpoints. A designer may program between one and a few of these breakpoints to cause the analyzing device to perform a specified action upon a condition's occurrence. For example, a first breakpoint might be programmed to look for a write to a certain memory address. When the first breakpoint triggers, it activates a second complex breakpoint, which may look for a certain program counter value. When the program counter reaches that value, a third complex breakpoint is activated, which may watch for a certain stack pointer value. When the stack pointer reaches the specified value, a fourth complex breakpoint is activated, which may watch for a certain accumulator value. Finally, when the accumulator value is reached the operation breaks.

Unfortunately, conventional analyzing devices offer only a few breakpoints, which are implemented as dedicated pieces of hardware, each looking for one condition. Because much of the hardware is dedicated to one function, it is prohibitively expensive to provide a substantial number of breakpoints. Consequently, only a limited number of events can be programmed and only a limited number of conditions can be monitored.

Furthermore, conventionally, separate systems are required to perform both logic analyzer and in-circuit-emulation functions. For example, conventional logic analyzers are able to monitor signals that an in-circuit-emulator would not normally analyze, such as signals that originate outside the circuit containing the emulator. Likewise, a logic analyzer would not normally provide emulation functionality. Consequently, substantial added expensive must be taken to purchase and maintain both systems.

Therefore, it would be advantageous to provide a device that may be used to analyze electronic circuits and software, that is relatively inexpensive, and can track a substantial number of conditions occurring during operation of an electronic circuit or software. It would also be advantageous to provide an analyzing device that is less hardware intensive than conventional analyzing devices, such as logic analyzers and emulators.

SUMMARY OF THE INVENTION

The present invention provides a cost efficient device that may be used to analyze a circuit or software under test. The present invention provides a solution that is less custom hardware intensive than conventional solutions and can track a substantial number of conditions occurring during operation of an electronic circuit or software. The present invention provides these advantages and others not specifically mentioned above but described in the sections to follow.

A device for executing an event thread is disclosed. The device has programmable logic for storing data to define a number of states in an event thread to be executed in the event engine. The device also has execution logic coupled to the programmable logic. The execution logic is configurable to execute the current state and re-configurable to execute the next state, in response to data from the programmable logic. In this fashion, the next state may be executed by re-configuring the execution logic. The device also has transition logic coupled to the programmable logic. The transition logic causes the next state in the event thread to be entered by loading new data from the programmable logic. Therefore, the execution logic is re-configurable during execution of the event thread.

Another embodiment provides for a method of executing an event thread. First, data defining a thread having a number of states is received. The data is stored in a memory array in a thread engine. Logic in the thread engine is configured to execute a first state of the thread by using first data from the memory array. A first state in the thread is executed by the logic. Then, the logic in the thread engine is re-configured to execute a second state by using second data from the memory array. Then, the second state in the thread is executed. Additional states are then executed by re-configuring the logic with additional data from the memory array to execute the event thread.

BRIEF DESCRIPTION OF THE DRAWINGS

FIG. 6 is an exemplary structure that may be used to program a memory array with values to configure an event engine, according to embodiments of the present invention.

FIG. 9 is an exemplary data structure that may be used to program a memory array with values to configure an event engine, according to embodiments of the present invention.

FIG. 12 is an exemplary data structure that may be used to program a memory array with values to configure combinational logic, according to embodiments of the present invention.

FIG. 13 is a table illustrating how values in the data structure of FIG. 12 may be used to implement various Boolean expressions, according to embodiments of the present invention.

FIG. 14 is a table illustrating how values in the data structure of FIG. 12 may be used to implement various complex Boolean expressions, according to embodiments of the present invention.

FIG. 18B illustrates tables describing output signals of chain logic blocks, according to embodiments of the present invention.

DETAILED DESCRIPTION OF THE INVENTION

In the following detailed description of the present invention, a device and method for implementing an event engine, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

RE-CONFIGURABLE EVENT ENGINES

Embodiments of the present invention may be able to reconfigure an event engine during execution of an event thread. In this fashion, the underlying hardware may be able to be used to execute many different states of the event thread by re-configuring the hardware during execution of the event thread. This may allow embodiments of the present invention to implement an event engine that supports very large numbers of states in the event thread, without dedicating hardware to perform a single state of an event thread.

Figure 1:
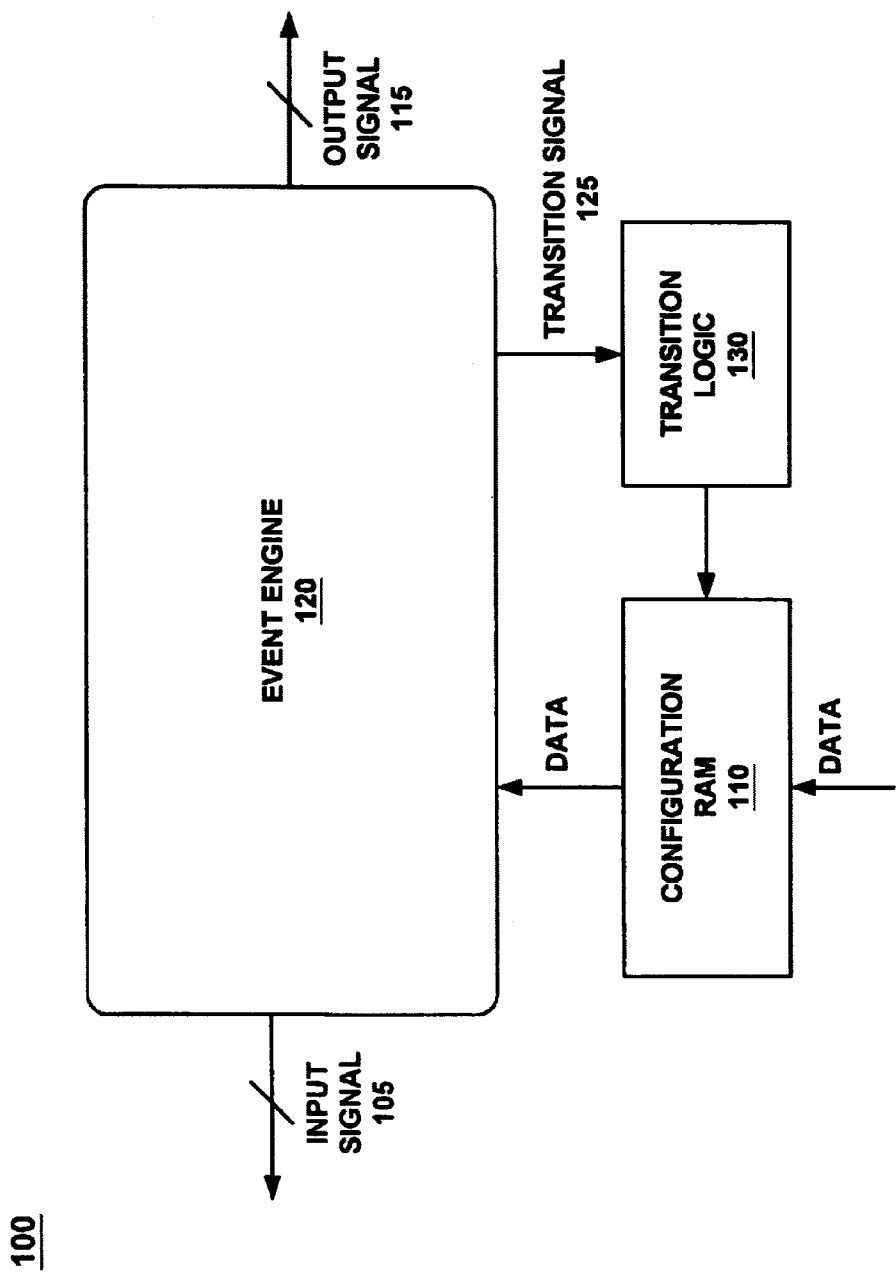
FIG. 1 is a block diagram of a device for implementing a programmable event engine, according to embodiments of the present invention.

FIG. 1 illustrates an embodiment of a device 100 for implementing an event engine 120. The device 100 may comprise programmable logic 110 (e.g., a memory array) for storing data to define a number of states in an event thread to be executed by the event engine 120. Throughout this description, the event engine 120 may also be referred to as execution logic 120. Throughout this description, the programmable logic 110 may also be referred to as configuration RAM 110. A designer who may be testing and debugging a circuit or software may define the event thread using a software package. The data defining the event thread may then be loaded into the configuration RAM 110. A first portion of the data stored in the configuration RAM 110 may be used to configure or to program the event engine 120 to execute a state of the event thread. Then, new data may be loaded from the configuration RAM 110 to reconfigure the event engine 120 to execute the next state of the event thread. One embodiment uses 64 bytes per state. Therefore, a substantial number of states may be programmed into the configuration RAM 110.

Still referring to FIG. 1, the event engine 120 may receive a number of inputs 105 and may be configured by the data in the configuration RAM 110 to select between the inputs 105. The event engine 120 may also be configured to look for a condition or event with respect to a selected input signal. Upon the condition's occurrence, the event engine 120 may output none, one, or multiple signals 115. The output signal(s) 115 may be used to initiate an action, such as a breakpoint, setting a trace buffer on or off, toggling an external trigger, etc. The event engine 120 may also be configured by the data in the configuration RAM 110 to select which signal it should output upon detection of the condition or event. The event engine 120 may also output a transition signal 125 when the condition it was configured to look for occurs.

The transition signal 125 may be fed into transition logic 130, which upon receiving the transition signal 125, may cause a new state to be entered by loading data out of the configuration RAM 110 to re-configure the event engine 120. In this fashion, the event engine 120 may be reconfigured on-the-fly or during the execution of an event thread.

Figure 2:
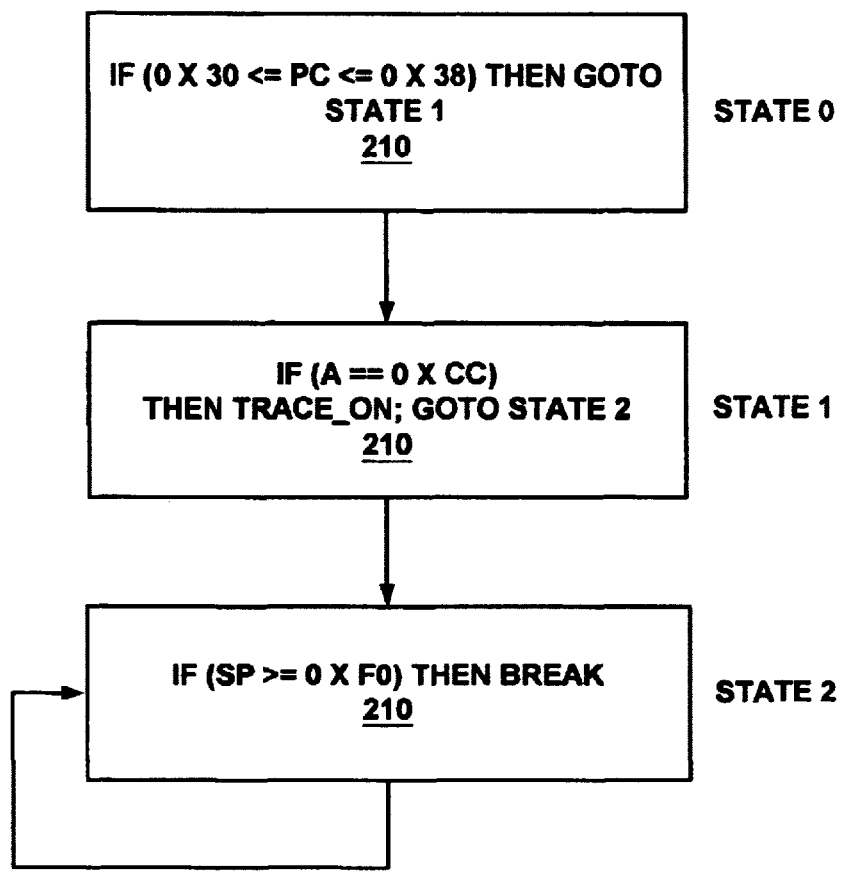
FIG. 2 is a diagram illustrating an event thread, which embodiments of the present invention may execute.

FIG. 2 illustrates an exemplary event thread 200 that may be executed in the event engine 120 of FIG. 1 and also in other embodiments of the present invention. The exemplary event thread 200 has three event cells 210; each event cell 210 may correspond to one state of the event thread 200. Embodiments may program or load the configuration RAM 110 with data that describe the event thread 200. In this example, during state 0, some of the data is used to configure the event engine 120 to monitor for the condition of the program counter being between 0x30 and 0x38. When this condition occurs, the event engine 120 may be put into state 1 by the transition logic 130. This may cause the configuration RAM 110 to reconfigure the event engine 120 to monitor for the condition of the accumulator equal to 0xcc. When this condition occurs, the event engine 120 may cause a trace to be turned on by outputting an appropriate signal. Additionally, state 2 may be loaded. In state 2, the event engine 120 may look for the condition of the stack pointer greater than or equal to 0xf0. When this occurs, the event engine 120 may cause a breakpoint signal to be output, which may stop the execution of, for example, code running in a microprocessor. When this occurs, state 2 may be reloaded, which may cause the event engine 120 to continue to monitor the stack pointer and to issue a break signal when, for example, the stack pointer is out of a valid range.

Figure 3:
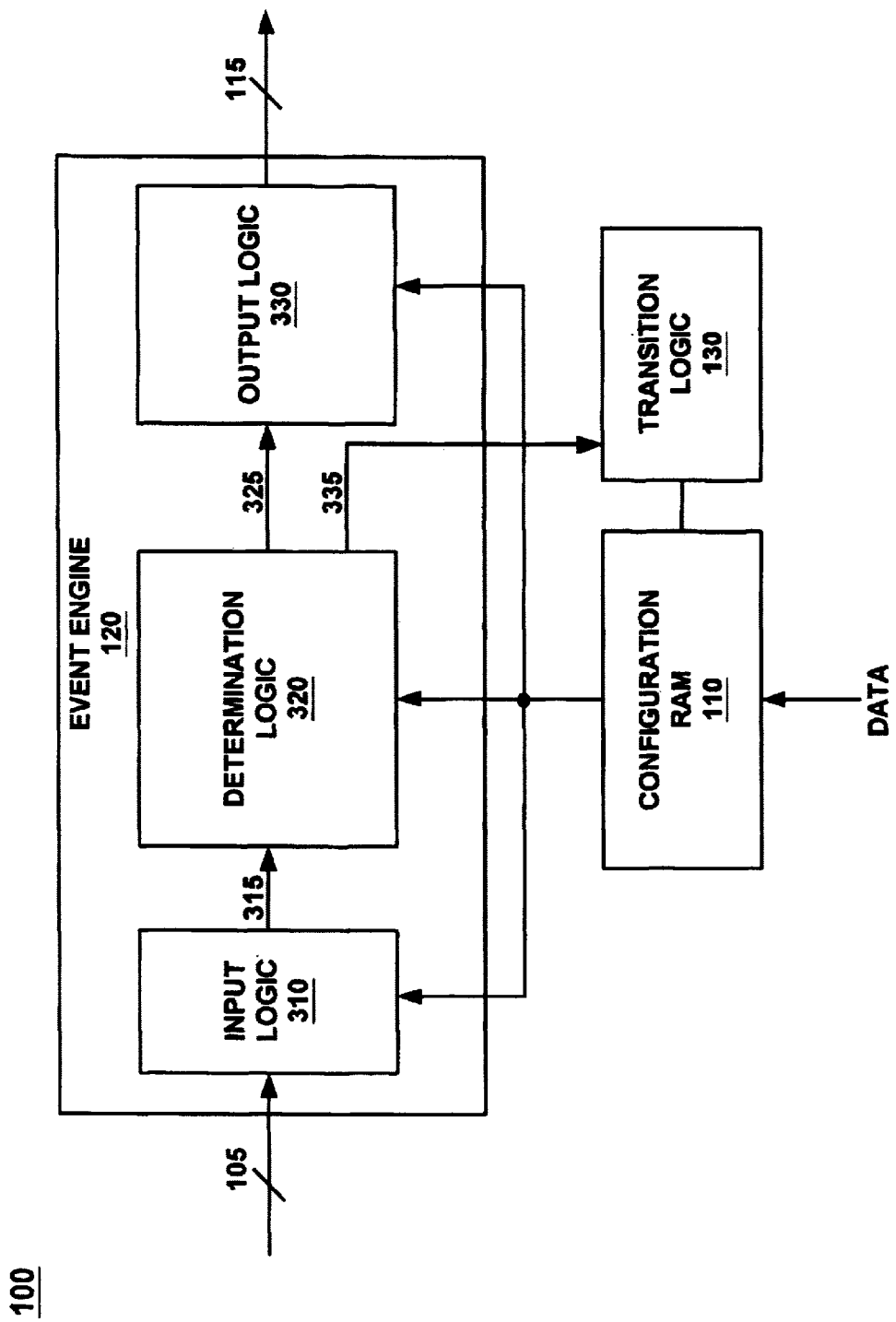
FIG. 3 is a block diagram of a device for implementing a programmable event engine, according to embodiments of the present invention.

Referring now to FIG. 3, to select between a number of inputs 105, the event engine 120 may have input logic 310 coupled to the configuration RAM 110. The input logic 310 may be configurable to select between a plurality of inputs 105 in response to the data from the configuration RAM 110. In this fashion, the input logic 310 is re-configurable when entering the new state by data from the configuration RAM 110. For example, in state 0 of FIG. 2, the input logic 310 may be configured to select the program counter, which may feed the determination logic 320. When the event engine 120 transitions to state 1, the input logic 310 may be reconfigured to select the accumulator, which may feed into the determination logic 320.

Still referring to FIG. 3, determination logic 320 may be coupled to the configuration RAM 110 and may be configurable by data from the configuration RAM 110 to detect a condition with respect to a selected input 315. Throughout this description, the determination logic 320 may also be known as detection logic 320. The determination logic 320 may also issue a trigger or hit signal 325 upon detection of the condition. The determination logic 320 may be re-configurable to detect a new condition during the new state. For example, in state 0 of FIG. 2, the determination logic 320 may be configured to look for the condition of the selected signal 315 fed to it by the input logic 310 (e.g., the program counter) being in a certain range. When the next state is entered, the determination logic 320 may be reconfigured by new data from the configuration RAM 110 to look for the condition of the selected signal 315 being equal to 0xcc, for example.

When the selected signal 315 is within the specified range, the determination logic 320 may also output a transition signal 335 to the transition logic 130. However, the same signal may be used for both the trigger signal 325 and the transition signal 335.

Still referring to FIG. 3, the event engine 120 may further have an output (or output logic) 330 coupled to the configuration RAM 110. The output 330 may be configured by data from the configuration RAM 110 as to which signal of a plurality of signals 115 it is to output upon receiving the trigger signal 325. For example, the output logic 330 could send out a breakpoint signal, an external trigger signal, a trace on/off signal, etc.

Figure 4:
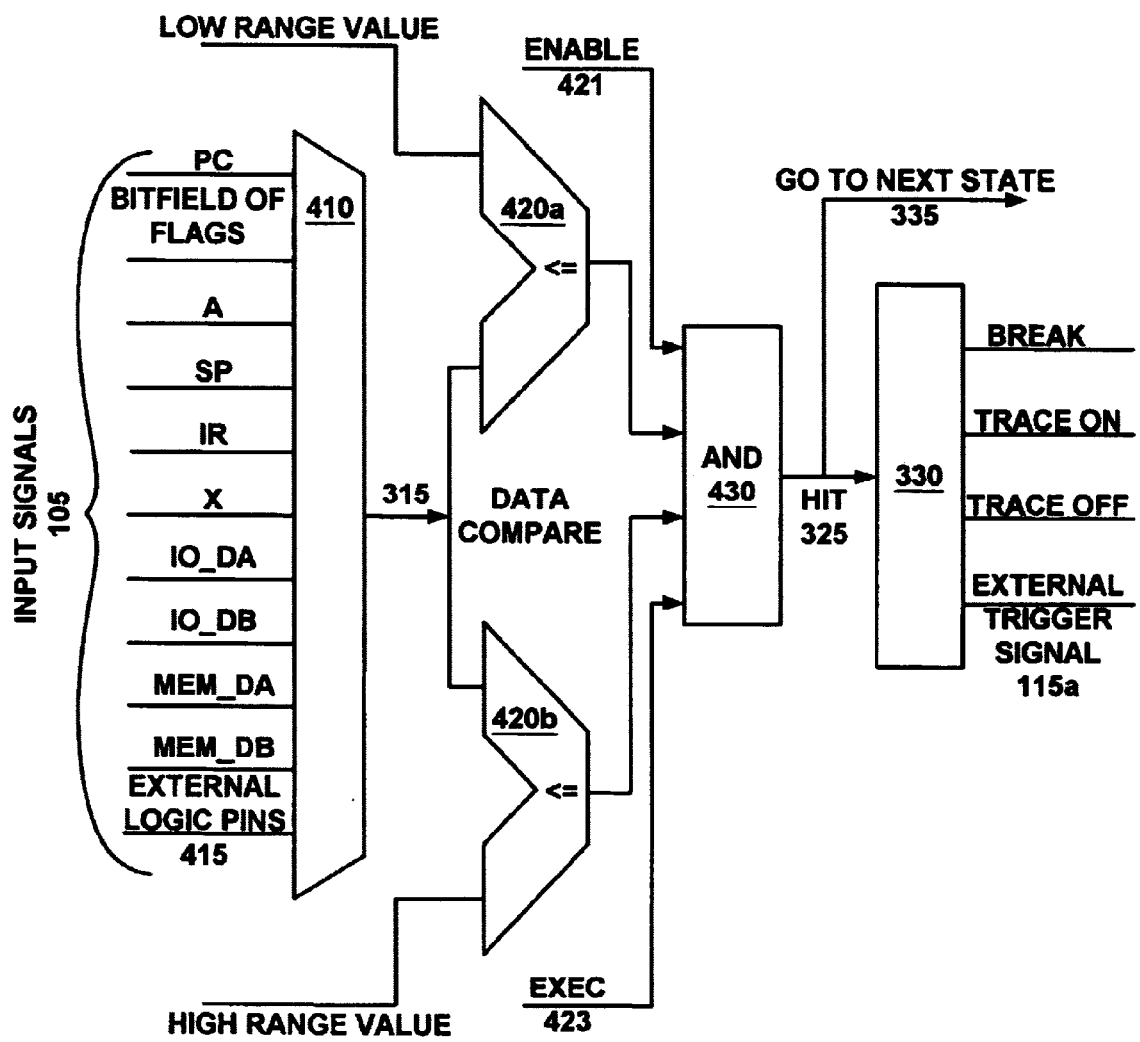
FIG. 4 is a block diagram of logic for executing an event thread, according to embodiments of the present invention.

FIG. 4 illustrates an embodiment of the event engine 120, in which the determination logic 320 is performed by a comparator. The input logic 310, in this embodiment, comprises a multiplexer 410 which inputs a number of input signals 105, which may include the program counter (PC), a bitfield of flags, the accumulator (A), the stack pointer (SP), the instruction register (IR), scratch register (X) (or index register), I/O data address (IO_DA), I/O data byte (IO_DB), memory data address (MEM_DA), memory data byte (MEM_DB), and external logic pin signals 415. Embodiments are suitable to receive any desired input. In this case, the inputs may be various signals and values of interest when testing and debugging a circuit or software.

The determination logic 320, in this embodiment, may comprise two comparators 420a, 420b. The upper comparator 420a may be fed a low range value, which may come from the configuration RAM 110. The lower comparator 420b may be fed a high range value, which may also come from the configuration RAM 110. As described herein, a user may enter data into a design program to build various data structures to implement the various event cells 210. For example, the user may input a low range value and a high range value for a given state of an event thread 200. Those values may be loaded in the configuration RAM 110 and then fed to the comparators 420a, 420b when the event engine 120 is to execute the given state of the given event thread 200.

Rather than using comparators, embodiments may use combinational logic, a mathematical block, or some arbitrary block of logic to see if the selected input signal 315 meets a condition specified by the data in the configuration RAM 110.

The comparators 420a, 420b may also be fed with the selected input signal 315. The determination logic 320 may also comprise a logical AND 430, which may have, as inputs, the output of each comparator 420a, 420b, an enabled bit 421, and an execute bit 423. The enabled bit 421 may be specified by the user and may be a part of the data stored in the configuration RAM 210. The enabled bit 421 may control whether a given event cell 210 will be executed. The optional execute bit 423 may allow a signal to be fed in from logic peripheral to the event engine 120. Thus, the event engine 120 may be effectively controlled by logic external to the event engine 120. For example, by preventing or allowing the decision logic 320 to output the trigger signal 325 and/or the transition signal 335, the event engine 120 and hence the event engine 120 may be controlled by external logic (not shown).

The determination logic 320 outputs a trigger signal 325 if all of the inputs to the logical AND are true. In the present embodiment, the output 330 is shown outputting, in response to the trigger signal 325, four different signals, which may be used to execute a break, to put trace on or off, or to initiate an external trigger, for example. The trigger signal 325 may also be fed into logic, such as transition logic 130, to cause the next state to be loaded. Alternatively, there may be a separate transition signal 335 and trigger signal 325, with one or the other not influenced by the execute bit 423 or influenced by a second bit. Thus, embodiments are able to output a signal 115, such that an action such as a breakpoint is initiated, without advancing to the next state of the thread 200. In a similar fashion, embodiments are also able to advance to the next state of the thread 200 without outputting the signal 115.

Figure 5:
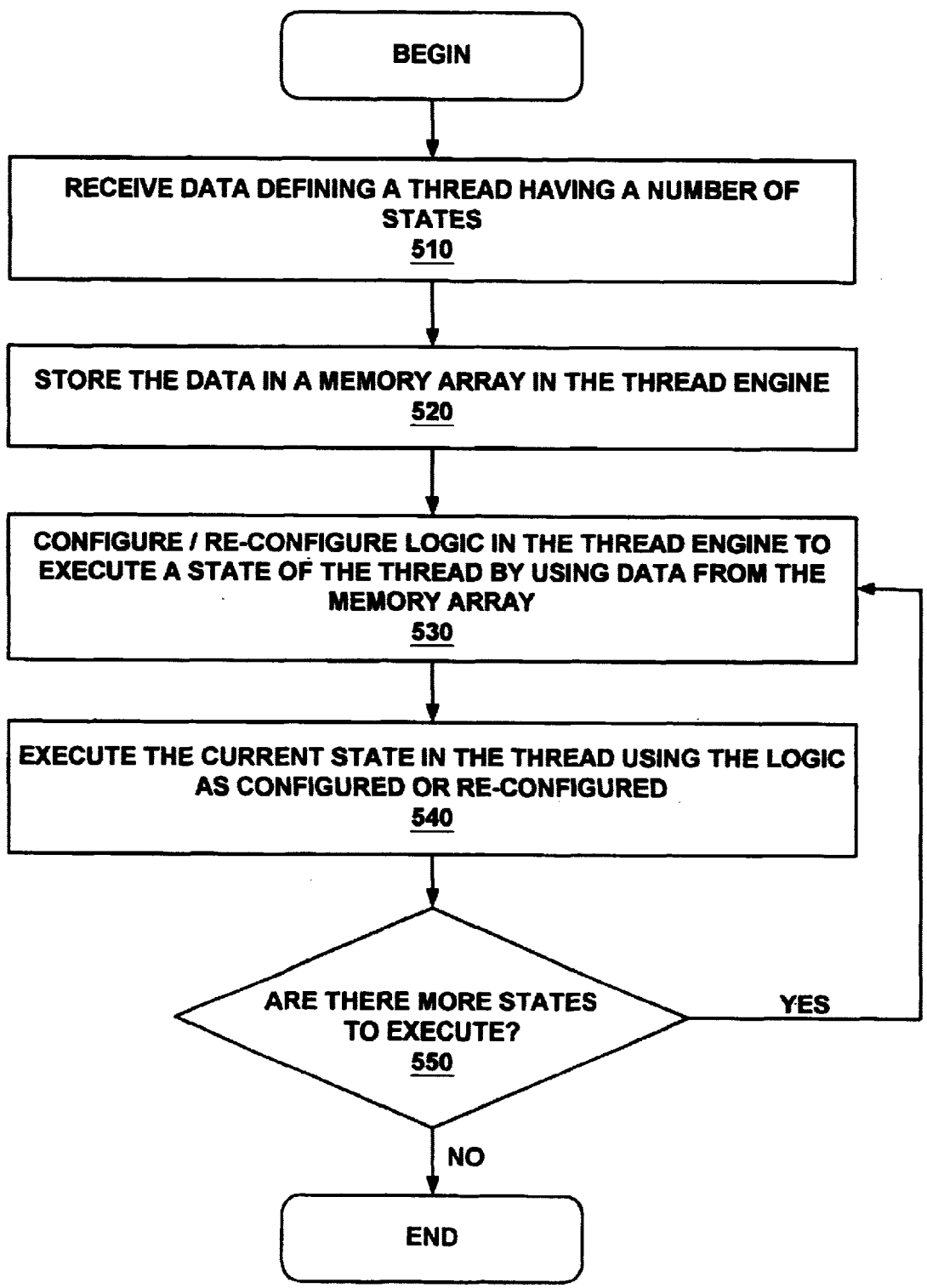
FIG. 5 is a flowchart of steps of a process of executing an event thread, according to embodiments of the present invention.

Referring now to process 500 of FIG. 5, an embodiment of the present invention provides for a method of executing an event thread 200. Step 510 may comprise receiving data defining an event thread 200 having a plurality of states as defined by event cells 210. For example, the event engine 120 may receive this data from the configuration RAM 110.

In step 520, the data may be stored in a configuration RAM 110 coupled to the event engine 120. For a given state of the thread 200, the data may define a condition to monitor for with respect to a selected input 315. The data may also define one or more actions to take upon the condition being met. The output logic 330 outputs a signal 115 to cause the action, such as initiating a breakpoint or setting trace on or off, etc. Optionally, the data may define that no action be taken.

Step 530 may comprise configuring the event engine 120 to execute a state of the thread 200 by using data from the configuration RAM 110. Thus, the input logic 310 may be configured to select between a number of input signals 105 and to output the selected signal 315. The determination logic 320 may be configured to determine if a selected input 315 meets a condition (e.g., an event is detected). The output logic 330 may be configured to select between a plurality of signals (e.g., it outputs one or more of the signals, such as breakpoint, trace on/off, toggle external trigger, etc.). This step may be repeated to execute additional states by re-configuring the event engine 120 by using additional data from the configuration RAM 110.

In step 540, the event engine 120 may execute the current state, as it has been configured or re-configured. In embodiments in which the event engine 120 is divided into several components (e.g., input logic 310, determination logic 320, and output logic 330), one or more of the components may be re-configured to execute the next state.

Step 550 may comprise a determination of whether there has been a transition to a new state. If so, step 530 may be repeated. Thus, the event engine 120 may be reconfigured during the execution of an event thread 200. If there has not been a transition, step 540 of the process 500 may be repeated.

Referring now to FIG. 6, an exemplary event cell data structure 600 for defining an event cell 210 is illustrated (e.g., a 16-bit event cell 210). Thus, the event cell structure 600 may be used to specify a single event thread state 210. While the exemplary structure is 64 bits, any suitable size may be used. Multiple such event cell structures 600 may be chained together to define the data for an event thread 200. Referring now to word 0 of the event cell structure 600, bit 31 may be for event thread enable. If this bit is off, then all of the associated control logic may be off and the event thread is not used. In this fashion, event threads 200 that are not being used may be turned off. Alternatively, an event thread 200 may be run for several states and then turned off. This may be implemented, for example, by feeding the enabled bit 421 in FIG. 4 into the AND logic 430.

Still referring to FIG. 6, bits 30:25 are the 'next' field, which may contain a pointer to the location of the next event cell data structure 600, and hence the next state in the event thread 200. This may allow a user to chain event cells 210 together by specifying the next event cell 210 to be executed in this field. If the event thread 200 meets its current condition, it may will transition to the state specified in this field. Bit 24 is an invert decision bit and may invert the output of the determination logic 320 (e.g., the trigger signal 325).

Figure 7:
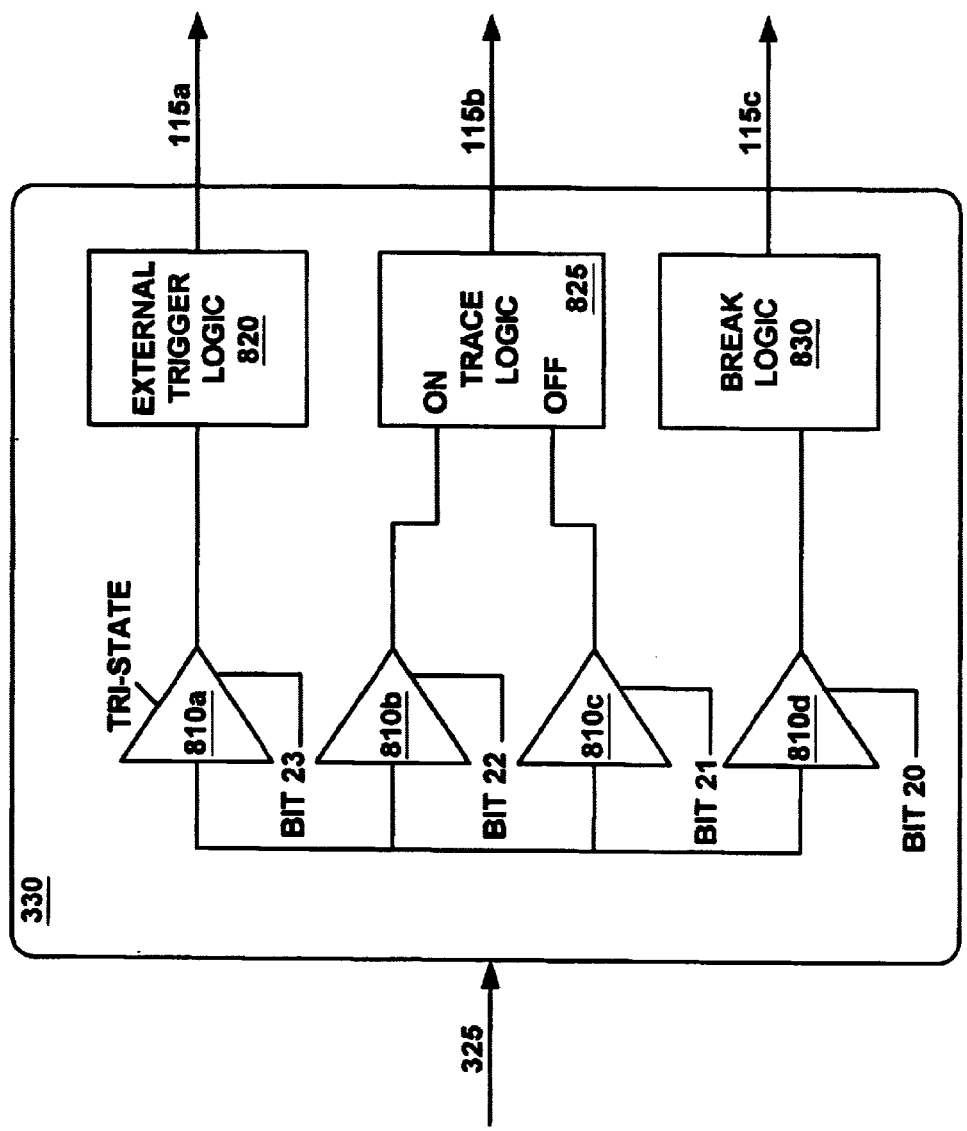
FIG. 7 illustrates exemplary output logic for an event engine, according to embodiments of the present invention.

In one embodiment, bits 20–23 may act as enables to tri-state buffers. Referring now to FIG. 7, the trigger signal 325 may be input to the output logic 330, which may have a number of tri-state buffers 810. If a tri-state buffer 810 is enabled then the trigger signal 325 may pass through tri-state 810 to its associated logic. For example, if bit 23 (external trigger bit) is set, it may enable tri-state buffer 810a, which may allow the trigger signal 325 to propagate through to the external trigger logic 820, which may toggle the value of an external logic pin. Bit 22 and 21 may be for setting trace on and trace off. The value of these bits may be fed into tri-state buffers 810b and 810c, respectively. In this fashion, the trace logic 825 may cause the trace signal 115b to be turned on or off when a condition occurs and the trigger signal 325 is propagated through. Bit 20 may be for initiating a break signal 115 and may be fed into the tri-state buffer 810d. Thus, when a condition is detected the break logic 830 may output a break signal 115c provided tri-state 810d is enabled. The output logic 330 may output many other signals, as well.

Embodiments allow multiple event engines 120 to be operating concurrently. In these embodiments, there may be a logical scheme to decide what to do when event engines 120 issue contradictory signals 115. For example, if one event engine 120 issues a signal 115 to turn the trace on and another issues a signal 115 to turn the trace off, the trace may be turned on to be sure information is stored. Any suitable scheme may be used when there is a conflict between signals 115 from different event engines 120.

Figure 8:
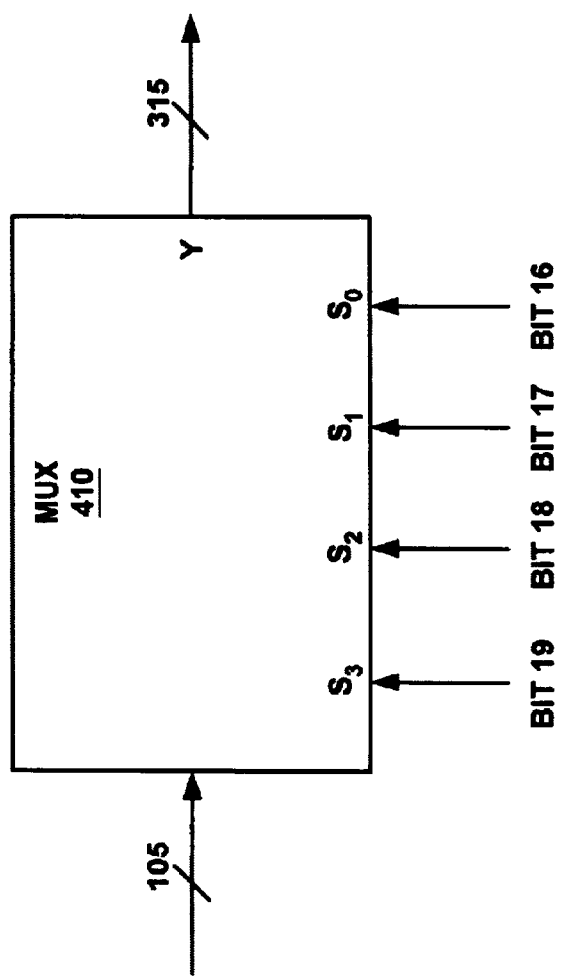
FIG. 8 illustrates exemplary input logic for an event engine, according to embodiments of the present invention.

Referring again to FIG. 6, bits 19:16 may control the input logic 310. For example, referring to FIG. 8, in one embodiment, bits 16–19 are fed into a multiplexer 410 to select between the inputs 105. The output of the multiplexer 410 may be the selected signal 315. The data format of FIG. 6 shows one method of allowing the user to specify which of the exemplary signals 105 is to be selected by the multiplexer 410.

Still referring to FIG. 6, bits 15:0 are for a counter start value and may allow the user to specify how many times a condition happens before the before the determination logic 320 generates a trigger signal 325 to initiate taking an action (e.g., outputting signal 115) and entering the next state. Thus, these bits may be fed into a counter logic (not shown), which is coupled to the determination logic 320.

Still referring to FIG. 6, word 1 of the exemplary data format may be used for range compare. Bits 31:16 are for a high word of the range compare and may specify the maximum value to look for. These bits may be fed into the upper comparator logic 410a, for example. Bits 15:0 specify the minimum value to look for in the range compare, and may be fed into the lower comparator logic 410b, for example.

Structure 900 of FIG. 9 is an exemplary data format for an eight-bit event cell 210. The present invention may use other formats with different fields. Bits 31:20 of word 0 are similar to the corresponding bits of the 16 bit exemplary structure 600. Bits 19:16 may define what the input logic 310 selects. Bits 15:0 are for the counter start value.

Referring now to word 1 of structure 900, bits 31:24 are reserved. Bits 23:16 may specify the maximum value for the range compare. Bits 15:8 are for bit masking and may be used to specify active bits for the compare. For example, active bits may be marked with a zero. Bits 7:0 are for the minimum value for range compare.

Chaining Event Threads

Figure 10:
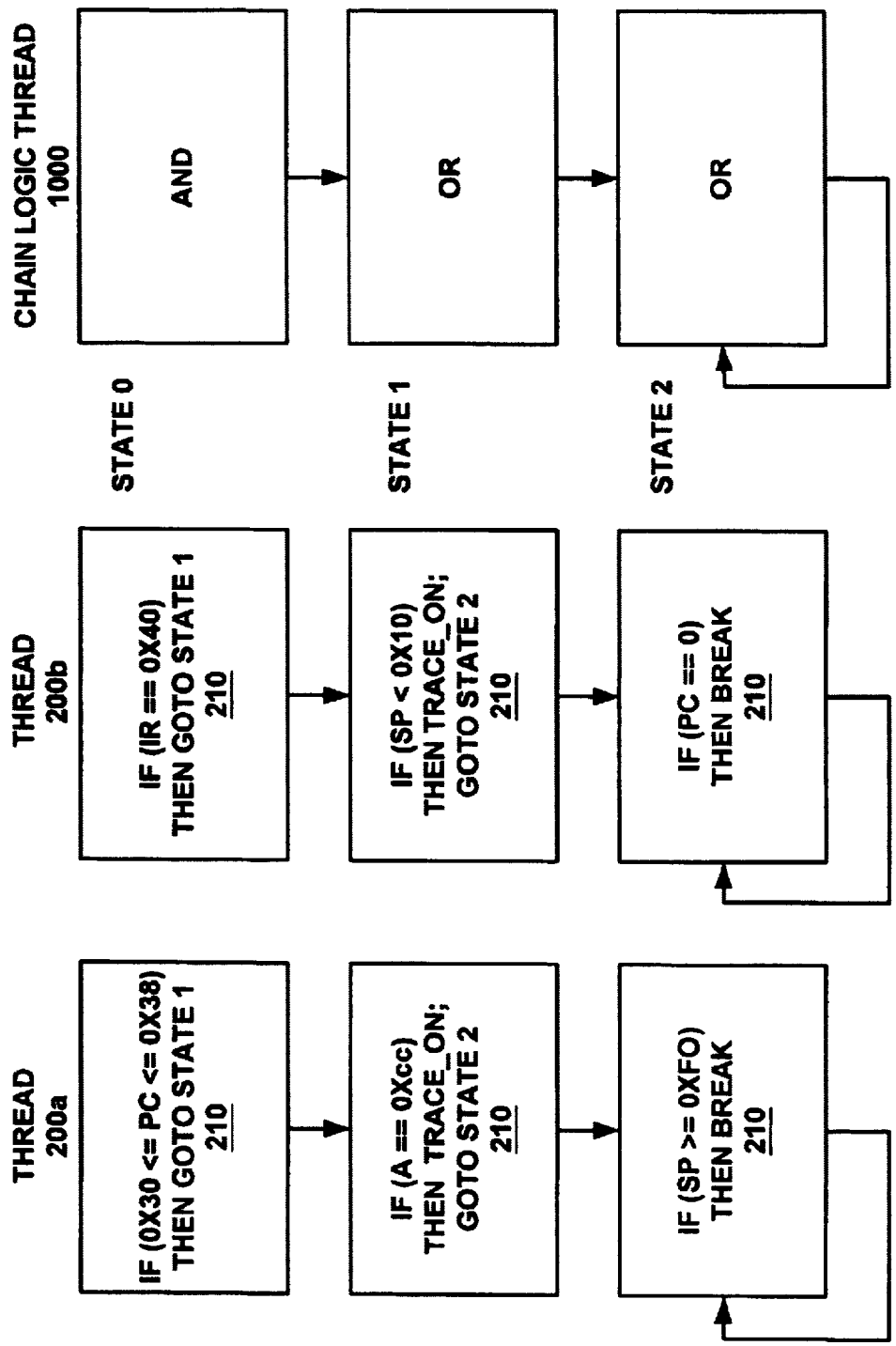
FIG. 10 is a flowchart illustrating a process of chaining event threads, according to embodiments of the present invention.

Referring now to FIG. 10, embodiments of the present invention provide for chaining together multiple event threads 200. An example of two event threads 200 that are chained together is illustrated in the flow diagram of FIG. 10. Thread 200a may be analogous to the thread illustrated in FIG. 2. Thread 200b has three states that are executed in parallel with the three states of thread 200a. For example, each event thread 200 may advance to its next state at the same time as the other event thread 200. However, when event threads 200 are chained, the next state may be entered based on a logical combination of signals from the event threads 200. For example, each event thread 200 may produce a hit signal 325 when a condition occurs. These hit signals 325 may be logically combined according to a Boolean expression formed by a logical operator in the given state in the chain logic thread 1000.

An example of such a logical combination will be discussed by referring to FIG. 10. In state 0, event thread 200a is testing for the occurrence of the program counter being between 0x30 and 0x38, while event thread 200b is testing for the condition of the instruction register equal to 0x40. In state 0, the chain thread 1000 has a logical operator of AND. Thus, the Boolean expression of "(thread 200a condition) AND (thread 200b condition)" may be formed. The event threads 200 may not advance to state 1 until the Boolean condition is true.

When the Boolean condition for state 0 is true, state 1 may be entered in which event thread 200a tests for the condition of the accumulator equal to 0xcc. During state 1, event thread 200b may test for the condition of the stack pointer less than 0x10. Based on the logical operator in state 1 of the chain logic thread 1000, the Boolean expression is "(accumulator=0xcc) OR (stack pointer <0x10)." Thus, state 2 may be entered when either condition is satisfied. In this case, both event threads 200a, 200b may issue a signal to set the trace on when their condition is satisfied. Since the logical operator is OR, the event thread 200 which caused the Boolean expression to be true may also cause the trace to turn on.

Embodiments of the present invention also provide for cases in which the logical operator is, for example, an AND with two or more event threads 200 triggering events upon the condition for which they are testing being satisfied. For example, if state 1 of the chain event 1000 were a logical AND, then the event threads 200a and 200b may not advance to state 2 until both conditions are satisfied. However, the trace may be set on when either event thread 200a or 200b has its condition satisfied. Alternatively, embodiments may require that the Boolean expression be true for the trace to be set to on.

Still referring to FIG. 10, in state 2, the Boolean expression that is formed is "(stack pointer>=0xf0) OR (program counter=0)." In this case, the action that may be triggered is a break (e.g., a break in the operation of the underlying software under test). State 2 is then repeated. While the embodiment illustrated in FIG. 10 comprises two event threads 200, embodiments of the present invention are suitable to chaining together large numbers of event threads 200. Furthermore, logical operators such as, for example, NAND and NOR, may be applied to the event threads 200 in addition to AND and OR.

Figure 11A:
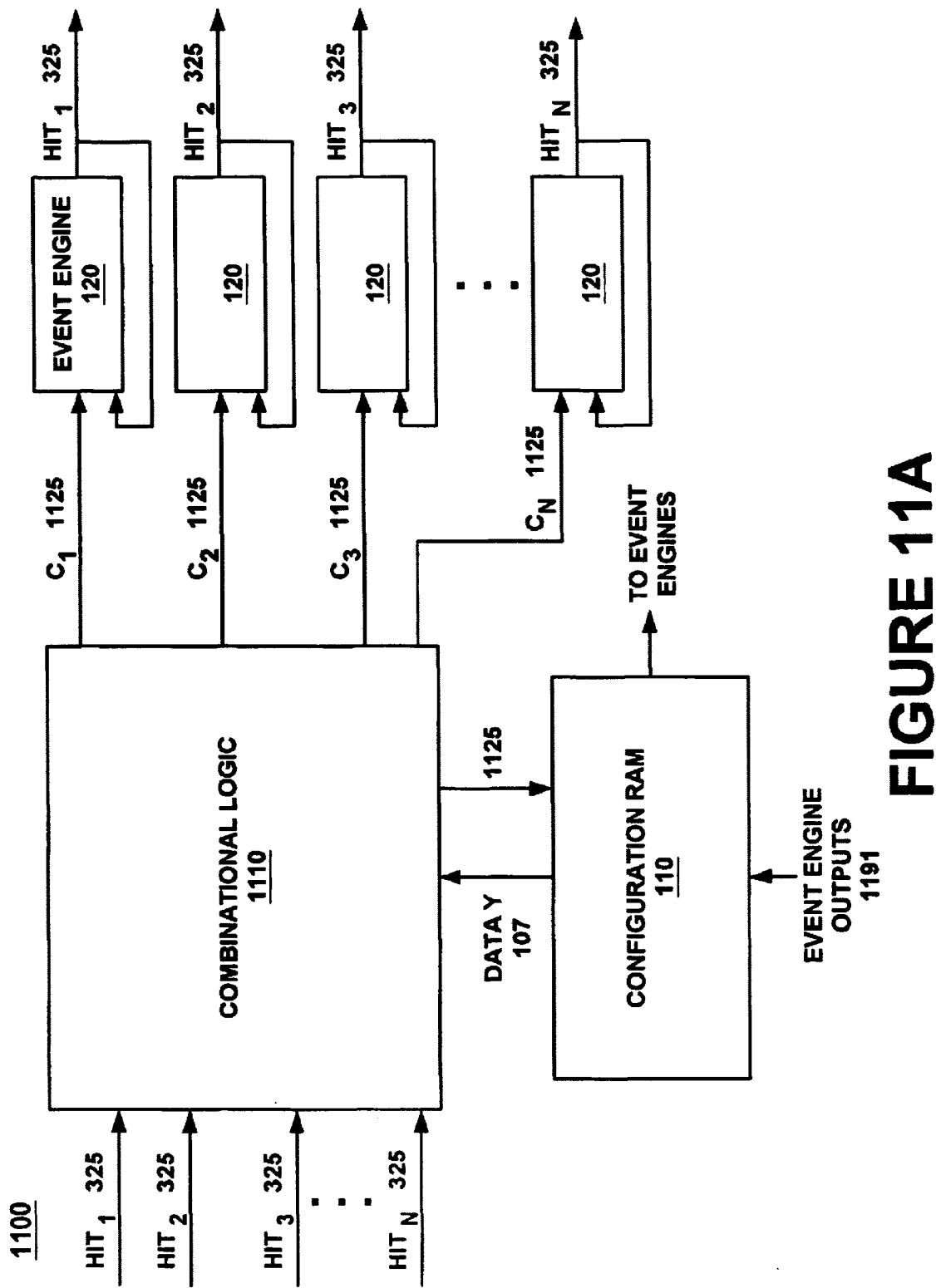
FIG. 11A is a block diagram of a device comprising chained event engines, according to embodiments of the present invention.

Referring now to FIG. 11A, embodiments of the present invention provide for chaining together multiple event threads 200 that are executed in event engines 120. Throughout this description, the phrase "chained event threads 200" may be equivalent to the phrase "chained event engines 120." The device for chaining event threads 1100 of FIG. 11A may have combinational logic or a chain logic block 1110, which may be programmed or configured by data stored in the configuration RAM 110 (e.g., a memory array or programmable logic) to output the result of a Boolean expression that is formed with selected inputs. Throughout this description, the term re-configurable combinational logic may comprise the combinational logic 1110, the configuration RAM 110, as well as other elements. The selected inputs may be chosen from the hit signals 325 that the event engines 120 produce in response to the occurrence of various conditions or events. In this fashion, the event threads 200 are chained together. However, the present invention is not limited to selecting the hit signals 325 as the operands in the Boolean expressions.

The event engines 120 may be programmed by the configuration RAM 110 to execute event threads 200 as discussed herein. The event threads 200 that run in the event engines 120 may be chained or run independently. The combinational logic 1110 may output a chain logic signal 1125 to each event engine 120. The chain logic signal 1125 may be formed from the result of a Boolean expression formed from selected input (e.g., hit) signals 325, along with a condition that may determine whether an event engine 120 is to be part of a chain. For example, to run all of the event threads 200 in the event engines 120 independently, the combinational logic 1110 outputs chain logic signals 1125 of: C1=C2=C3=Cn=true. In this fashion, the event engines 120 all see a true input from the combinational logic 1110 and thus are not affected by the input signal. To run any single event engine 120 independently, the combinational logic 1110 feeds it a "1". Event engines 120 that are chained may see a chain logic signal 1125 that has the same value and whose value may depend on whether a Boolean condition is true. The hit signals 325 of the event engines 120 may also be fed back into the event engines 120.

In one embodiment, chain logic signals 1125 from the combinational logic 1110 may be fed into the configuration RAM 110 (possibly though other logic that is not shown). The chain logic signals 1125 may be used to select the data that the configuration RAM 110 outputs to re-configure the combinational logic 1110. However, this is not required. Event engine outputs 1191 (e.g., hit signals 325 or other signals from the event engines 120) may also be input to the configuration RAM 110 to select data 1107 from the configuration RAM 110. The data may be used to re-configure the combinational logic 1110 and/or the event engines 120.

Referring briefly to FIG. 4, an embodiment inputs a signal (e.g., signal 1125) from the combinational logic 1110 as the exec signal 423 into the logical AND 430. In this fashion, if the exec signal 423 is true, the output of the AND 430 may be controlled by the other inputs to the AND 430. The hit signal from the event engine 120 may be taken from a gate (not shown) which combines the inputs of the AND gate 430 except the exec signal 423. In this fashion, when the condition for which the event engine 120 tests for is satisfied, a hit signal 325 may be output to the combinational logic 1110.

Figure 11B:
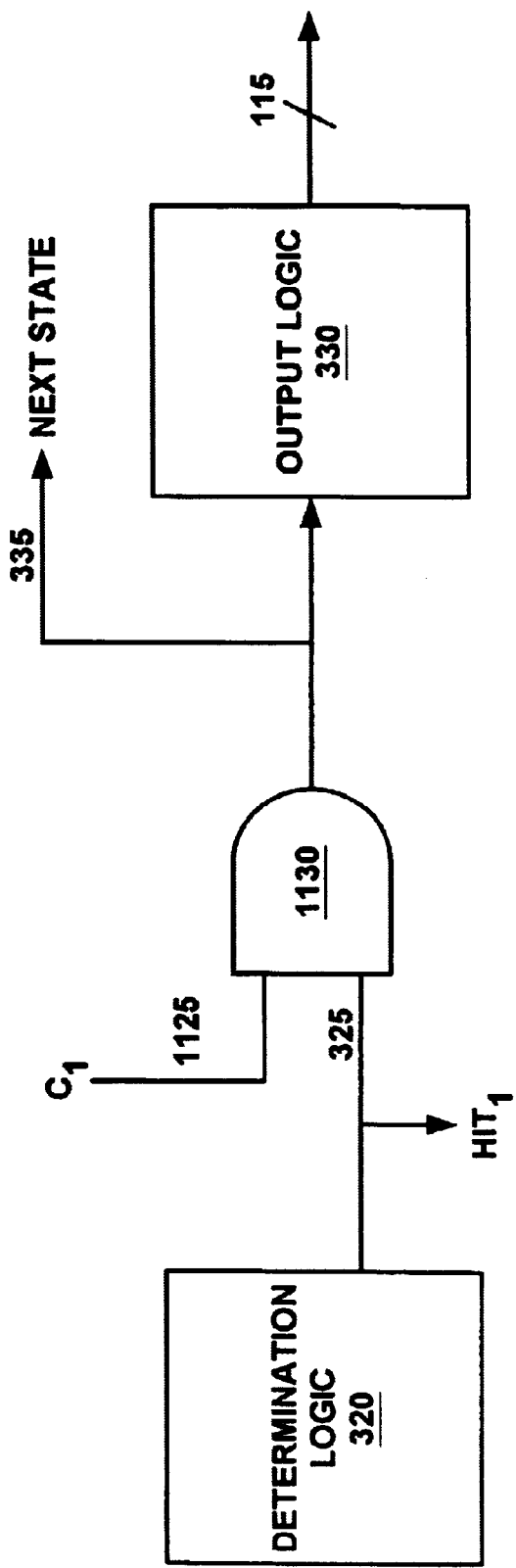
FIG. 11B and FIG. 11C are block diagrams illustrating a signal input into a portion of an event engine, according to embodiments of the present invention.

This technique may also be performed by the embodiment illustrated in FIG. 11B, in which a signal 1125 (e.g., C1) from the combinational logic 1110 is input to the AND gate 1130, which may also input the trigger or hit signal 325. The hit signal 325 may also be fed to the input of the combinational logic 1110. The output of the AND gate 1130 may be input to the output logic 330 and may also be used as the transition signal 335, which may be fed into transition logic 130. Each event engine 120 may have a signal 1125 (e.g., C1, C2, etc.) fed from the combinational logic 1110, though not necessarily the same signal. Those event engines 120 running the event threads 200 that are being chained may have the result of the Boolean expression input into their respective AND gates 1130. However, those that are not being chained (e.g., are being run independently) may have a logic "1" input. If signal C1 is always "1", the output of the AND 1130 may be controlled by the hit signal 325. In this fashion, when the event engine 120 is not a part of a chain, it may execute independently.

When an event engine 120 is chained, the signal 1125 (e.g., C1) may be equal to the result of the Boolean expression, and the output of the AND gate 1130 may be "0" while the Boolean expression is false. In this case, the next state may not be entered and no actions may be triggered by the output logics 330 of any of the event engines 120. When the Boolean expression is true, the event engine(s) 120 which produced a hit signal(s) 325 may have a logical "1" at the output of their AND gate(s) 1130, which may trigger a next state and may also will trigger the output logic(s) 330 of the event engine(s) 120 which produced a hit signal(s) 325. The next state may be initiated in all of the chained event engines 120 by having the memory array 110 send the data for the next state to each chained event engine 120.

Figure 11C:
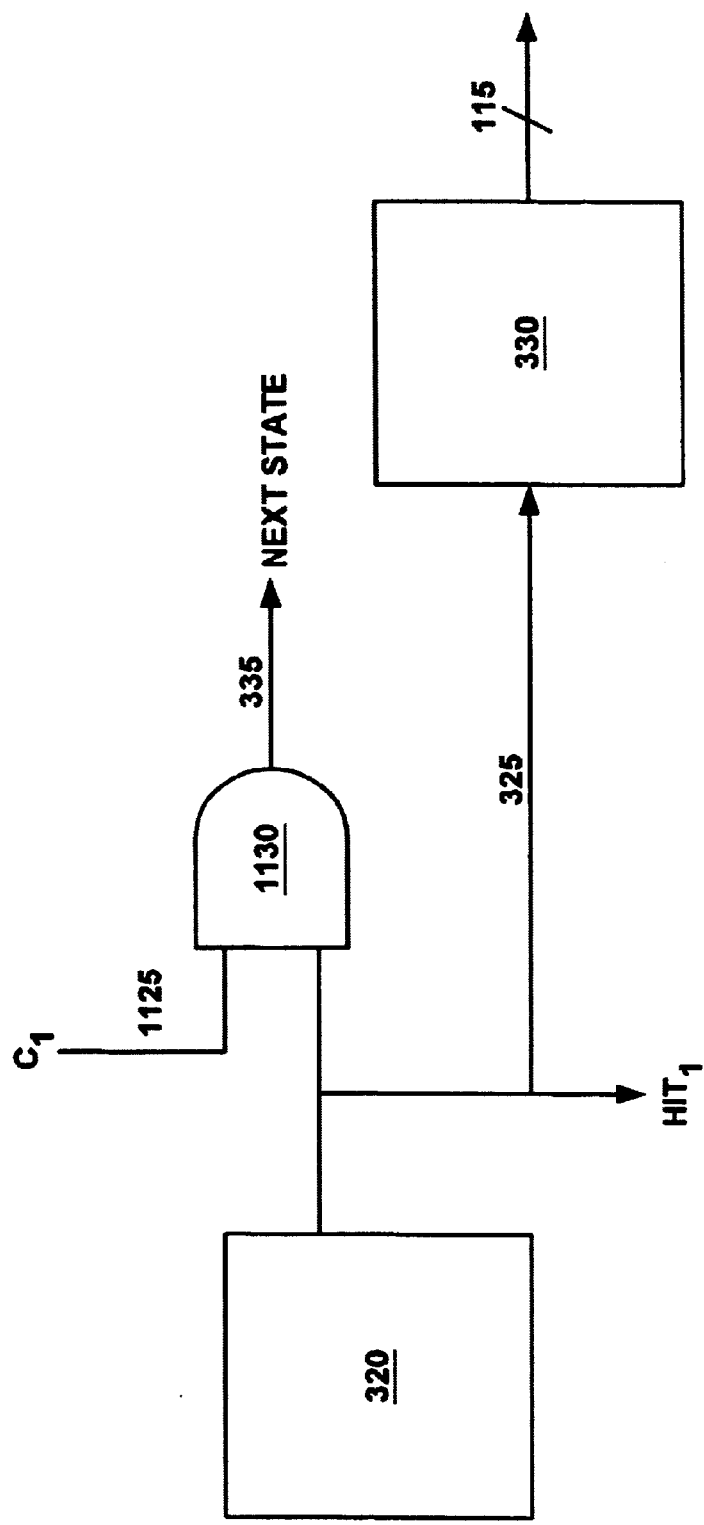

In some cases, it may be desirable to trigger an action when the event for which a chained event engine 120 is testing for is satisfied, even if the next state is not to be entered because the Boolean expression is false. Referring now to FIG. 11C, a block diagram is illustrated to implement such an embodiment. In this embodiment, the input to the output logic 330 may be received directly from the trigger or hit signal 325. In this fashion, the action may be triggered by the output logic 330 regardless of the result of the Boolean expression (e.g., regardless of the value of signal 1125 or C1). However, the next state may still be triggered by the combination of the trigger or hit signal 325 and the output signal 1125 (e.g., C1) of the combinational logic 1110. The present invention is not limited to the methods illustrated in FIGS. 11B and 11C for inputting the result (e.g., signal 1125) of the Boolean expression into the event engines 120 and for producing next states and output actions from the output logic 330.

Referring now to FIG. 12, an exemplary chain data structure 1200 that is used to configure a chain logic block 1110 is shown. A single chain data structure 1200 may be used to configure the chain logic block 1110 for a single state and may be used to chain together a number of event threads 200.

Bits 30:24 specify a pointer to the next chain data structure 1200 to execute. Thus, these bits may specify the next slave chain logic state for the chain logic block 1110 to execute. In this fashion, the logical function (e.g., AND, OR, NAND, NOR) may be altered from state to state. Also, the event threads 200 that are being chained may be changed from state to state. Bit 17 is for an enable bit, which may enable the chain logic block 1110 that the chain data structure 1200 configures.

Bit 16 is an inverting bit, which may invert the result of the Boolean expression. For example, if the chain logic block 1110 was implementing "thread 0 AND thread 1," the invert may implement "NOT (thread 0 AND thread 1)."

Bits 15:0 may specify which event threads 200 are to be chained together. There is a positive logic enable and a negative logic enable for each event thread 200, which may allow the chain logic block 1110 to use the inverse of the input from a given event thread 120 in the Boolean expression. Both bits may be set to "0" to cause the chain logic block 1110 to ignore given the event engine 120. For example, it may not use the hit signal 325 from the given event engine 120 and it may output a constant logical "1" to the event engine 120 so that it is not affected by the combinational logic 1110.

In the example in FIG. 12, up to eight event threads 200 may be chained together. Embodiments of the present invention are able to chain together very large numbers of event threads 200. To do this, the data structure 1200 may be made larger to specify additional event threads 200. Then, the underlying chain logic block 1110 is made wider but not deeper. This may not slow down the chain logic block 1110 because embodiments implement the chain logic block 1110 with tri-state logic, as opposed to multiplexers.

As discussed herein, embodiments of the present invention are able to implement logical operators such as, for example, OR, AND, NOR, and NAND. The table 1300 illustrated in FIG. 13 demonstrates how various bits in the structure 1200 of FIG. 12 may be set to implement various logical operators. To form a logical OR, the chain enable bit (e.g., bit 17) may be set to "1" to enable this chain logic thread 1000. The invert output bit (e.g., bit 16) may be set to "1". For each event thread 200 to be chained, the positive logic enable may be set to "1". In this fashion, a logical OR may be created. For example, if the positive logic enables of event threads 7, 6, and 1 are set to "1" , and if the event threads 200 are testing for the occurrence of conditions A, B, and C respectively, then the Boolean expression may be "A OR B OR C."

Still referring to Table 1300 of FIG. 13, a logical NOR may be applied to the event thread 200 conditions or events by setting the invert output bit to "0" and the enable bit to "1". For each event thread 200 to be chained, the positive logic enable may be set to "1". In this fashion, the expression "NOT (A OR B OR C)" may be formed using the exemplary event threads from the previous paragraph.

To form an expression with AND as the logical operator, the chain enable bit may be set to "1" and the invert output bit may be set to "0". For each event thread 200 to be chained, the positive logic enable may be set to "0" and the negative logic enable bit may be set to "1". Thus, an expression such as, "A AND B AND C" may be formed, where A, B, and C are conditions being tested for by separate event threads 200.

To form a logical NAND, the chain enable bit may be set to "1" and the invert output bit may be set to "1". The rest of the bits may be set as for the previously described logical AND.

Embodiments of the present invention are also able to form Boolean expressions in which selected inputs are inverted. For example, expressions such as "A(NOT) AND B AND C" may be created. The expression may be stored in the configuration RAM 110, which may be used to configure the combinational logic 1110. Referring now to FIG. 14, the table 1400 illustrates one way such expressions may be formed. For example, to form the Boolean expression, "A(NOT) OR B OR C," the chain enable and invert bits may be set to "1". The negative logic enable for event thread A may be set to "1". For event threads B and C, the positive logic enable bit may be set to "1". In this fashion, the expression may be stored in the configuration RAM 110, which may be used to configure the combinational logic 1110.

Similar expression may be formed with the logical operators AND, NOR, and NAND. For example, table 1400 illustrates one possible set of rules for forming the following expressions: "A AND B(NOT) AND C"; "NOT (A OR B(NOT) OR C)"; and "NOT (A AND B(NOT) AND C(NOT))".

Figure 15:
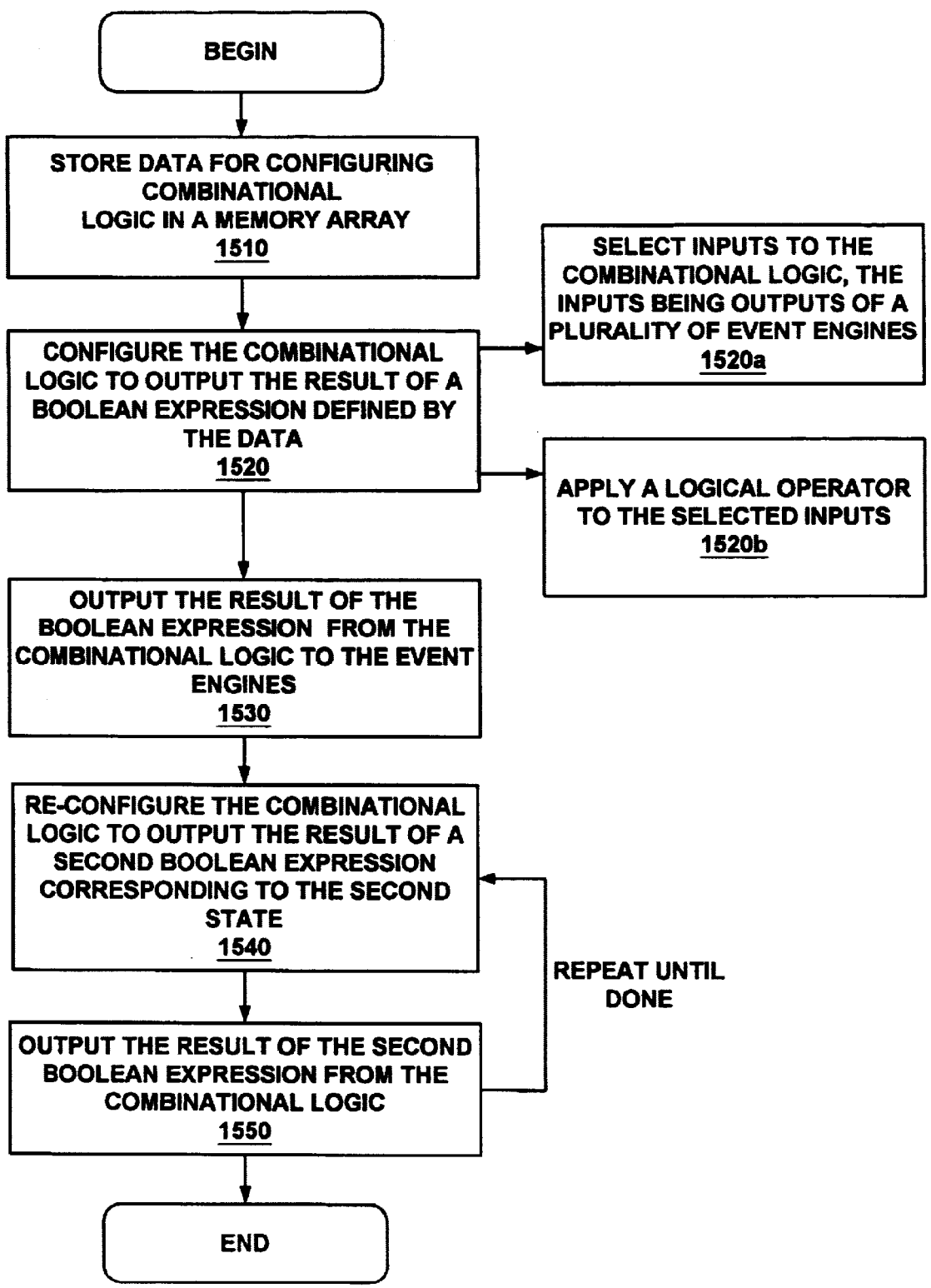
FIG. 15 is a flowchart illustrating a process of chaining event threads, according to embodiments of the present invention.

An embodiment of the present invention provides for a method of chaining event engines 120. Referring now to Process 1500 of FIG. 15, in step 1510, data for configuring combinational logic 1110 may be stored in a configuration RAM 110. The data may allow the configuration logic 1110 to be configured to implement Boolean expression formed by selected inputs.

In step 1520, the combinational logic 1110 may be configured to output the result of a Boolean expression. This step may comprise sub-steps 1520a of selecting inputs to the combination logic 1110. For example, the inputs may be selected from available outputs of a number of event engines 120. This step may also include inverting one or more of the selected inputs.

Step 1520 may also comprise sub-step 1520b in which a logical operator may be applied to the selected inputs. For example, the logical operator may be defined as described herein with respect to the discussion of FIG. 13.

In step 1530, the combinational logic 1110 may output the result of the Boolean expression that it was configured to implement. The output may be fed into the event engines 120 that had their outputs selected as inputs to be used in the Boolean expression. In this fashion, the event engines 120 may be chained together by the Boolean expression. This step may also include inverting the result.

In step 1540, the combinational logic 1110 may be re-configured to output the result of another Boolean expression, based on further data from the configuration RAM 110. This re-configuration may comprise changing the logical operator from the previous Boolean expression. It may also include changing which event engines 120 are chained. For example, it may include changing which outputs from the event engines 120 are selected as inputs to be used in the new Boolean expression. It may also include changing which event engines 120 receive the output of the combinational logic 120 (e.g., the result of the Boolean expression).

In step 1550, the combinational logic 1110 may output the result of the new Boolean expression to the event engines 120 that were selected to be chained in this state. The process 1500 may repeat steps 1540 and 1550 until all states are executed.

Figure 16:
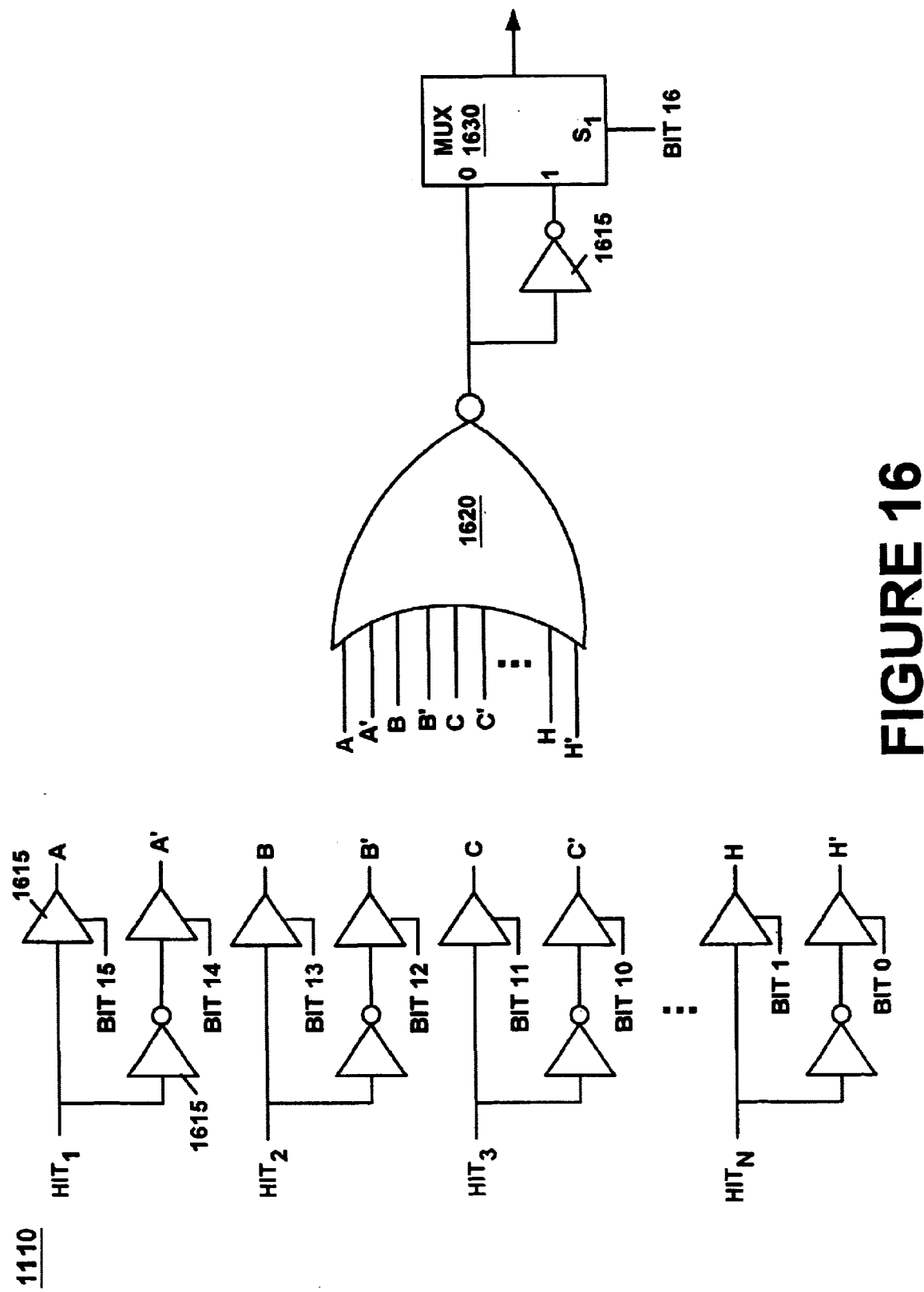
FIG. 16 is a diagram illustrating exemplary logic to implement re-configurable combinational logic, according to embodiments of the present invention.

FIG. 16 illustrates an exemplary logical block diagram for implementing the combinational logic 1110 including various bits from a slave chain logic data structure 1200. The hit signals 325 from the event engines 120 may be input into the combinational logic 1110 by splitting a given hit signal 325 (e.g., hit 1) into two signals. One of the signals 325 may be fed directly into a tri-state buffer 1610 and the other may be input into an inverter 1615 before a tri-state buffer 1610. Bits 15:0 of the slave chain logic data structure 1200 may control the tri-state buffers 1610, whose outputs may be input to the NOR gate 1620. In this fashion, the hit signals 325 that have their bits set to "1" in the slave chain logic data structure 1200 may have their signals input to the NOR gate 1620.

The NOR gate 1620 may have its output split with one branch going directly into the MUX 1630 and the other branch first going through an inverter 1615. Bit 16 (e.g., the invert output bit) of the slave chain logic data structure 1200 may be used to select the final output of the combinational logic 1110. The present invention is not limited to the logical circuitry illustrated in FIG. 16 for implementing the combinational logic 1110.

Event System Architecture

Embodiments of the present invention are able to configure event engines 120 into multiple chains and reconfigure the chains on the fly. The event engines 120 may be allowed to run independently or may be chained in multiple chains. For example, the initial execution scheme may comprise two chains. The first chain may have two event engines 120 chained together with one monitoring for the PC to be outside a given range and the other event engine 120 monitoring for the accumulator going over a specified value. The second chain may comprise two other event engines 120 chained with one monitoring for a specified address being accessed and the other monitoring for a specific data value crossing the bus. If the first chain detects its condition (or combination of conditions for which its event engines 120 were configured to monitor), the configuration of the first two event engines 120 may be altered, without affecting the second two event engines 120. For example, if the PC goes out of range, the execution scheme may be re-configured by breaking the first chain. For example, the first two event engines 120 may execute independently to monitor two conditions that are different from when they were chained. As another example, in an initial execution scheme the event engines 120 may be monitoring for different conditions, but in a chained fashion, such that when any of them detects its condition, the execution scheme is modified. For example, the modification may be that all event engines 120 begin to execute independently, other chains of event engines 120 are formed, etc.

Figure 17:
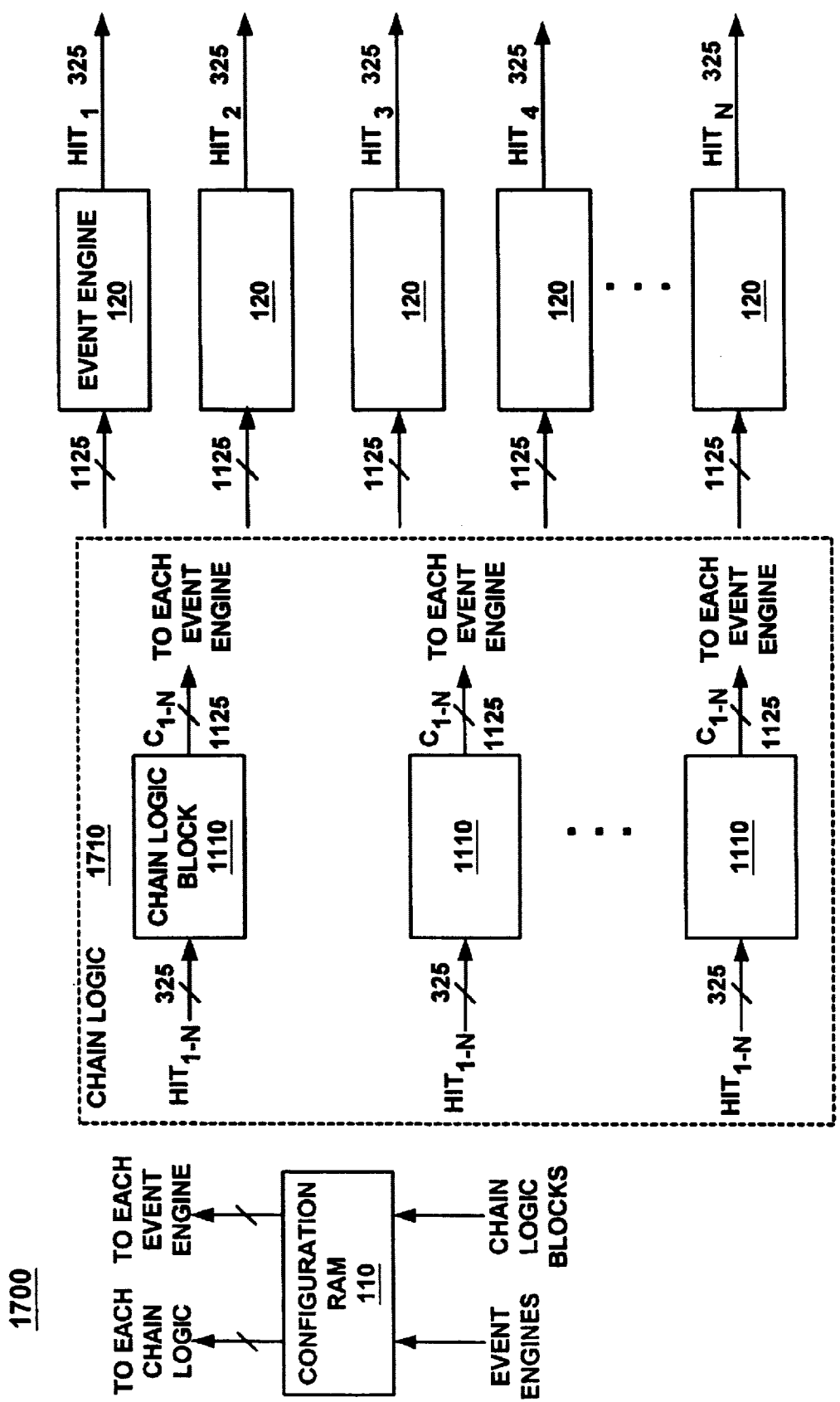
FIG. 17 is a block diagram illustrating event architecture, according to embodiments of the present invention.

Referring now to FIG. 17, an event system architecture 1700 is illustrated. The event system architecture 1700 may have a number of event engines 120, which may be for monitoring conditions and may produce hit signals 325 in response to conditions being satisfied or events being detected. The event system architecture 1700 may have a chain logic 1710 comprising a number of combinational logics or chain logic blocks 1110 that input the hit signals 325. The event system architecture 1700 may also have a configuration RAM 110 for storing data to configure the chain logic blocks 1110 such that the chain logic blocks 1110 configure the execution scheme of the event engines 120. For example, the event engines 120 may be chained in any fashion or may execute independently.

Still referring the FIG. 17, the chain logic blocks 1110 may each output a chain logic signal 1125 to each event engine 120. If a given chain logic block 1110 is not currently chaining the execution of a given event engine 120 it may output a chain logic signal 1125 of "1". In this fashion, the event engine 120 may be unaffected by the chain output signal 1125. For example, active event engines 120 may be run independently. By active event engines 120 it may be meant that a given event engine 120 is currently monitoring for a condition. Event engines 120 may be made active or inactive as described herein by setting, for example, a bit in the data block (e.g., bit 31 of FIG. 6 or FIG. 9) that may configure that event engine 120. The chain logic blocks 1110 may also configure the event engines 120 to form one or more chains of execution.

The chain logic blocks 1110 may be configured by data from the configuration RAM 110 to configure the execution scheme of the event engines 120. For example, each chain logic block 1110 may be configured to select certain hit signals 325 and form a Boolean expression with them. Each chain logic block 1110 may then output a chain logic signal 1125, which may be based on both the result of its Boolean expression and whether the event engine 120 to which the chain output signal 1125 is sent is to be chained. In this fashion, the chain output signals 1125 may chain the execution of the event engines 120.

In one embodiment, chain logic signals 1125 from the chain logic 1710 may be fed into the configuration RAM 110 (possibly though other logic that is not shown). The chain logic signals 1125 may be used to select the data that the configuration RAM 110 outputs to re-configure the chain logic 1710. However, this is not required. Event engine outputs (e.g., hit signals 325 or other signals from the event engines 120) may also be input to the configuration RAM 110 to select data from the configuration RAM 110. The data may be used to re-configure the chain logic 1710 and/or the event engines 120.

Figure 18A:
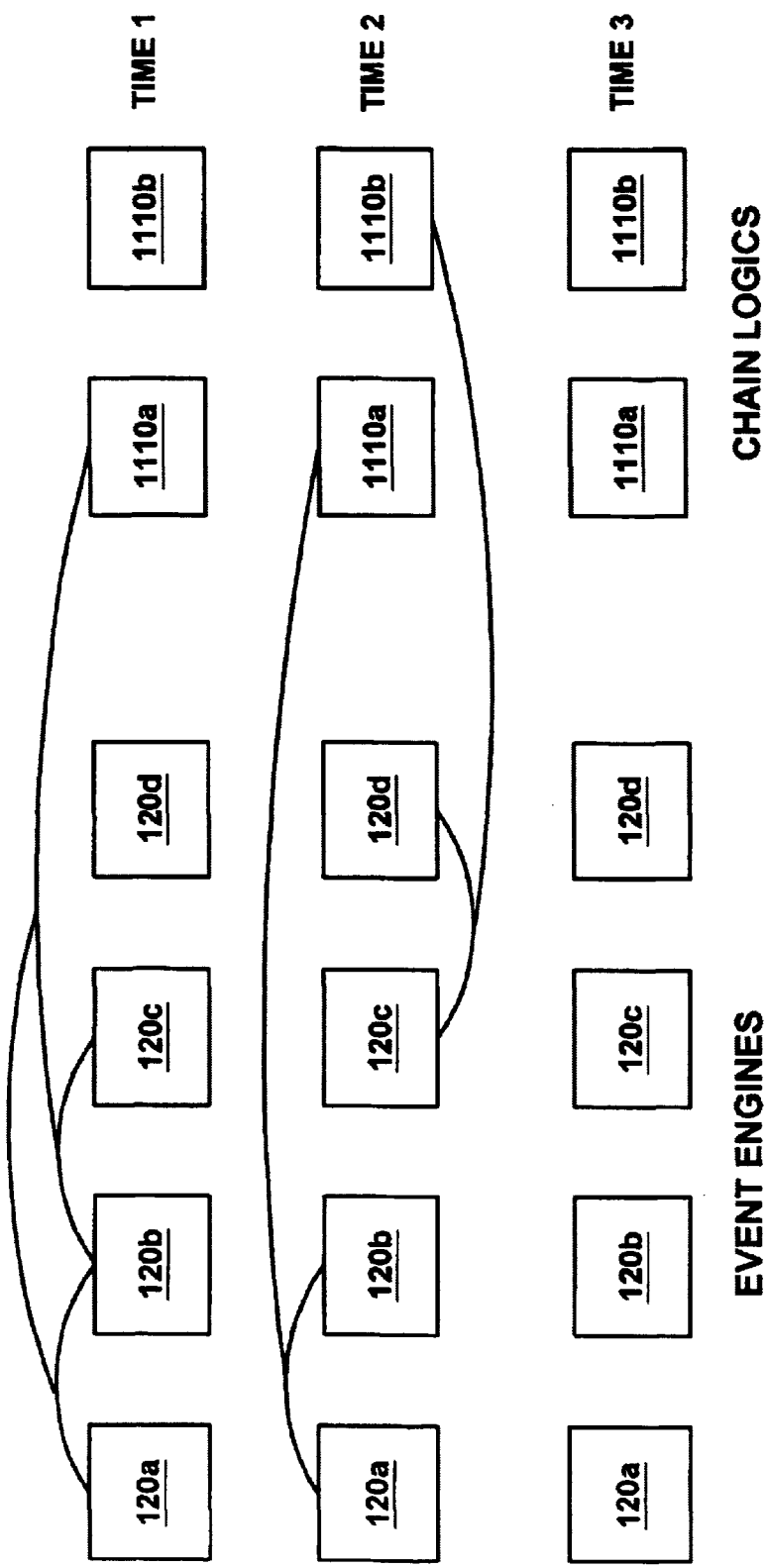
FIG. 18A is a diagram illustrating event engines chained in various execution schemes, according to embodiments of the present invention.

Embodiments that have at least one chain logic block 1110 for every two event engines 120 may configure the execution scheme of the event engines 120 in any fashion. Referring now to time 1 of FIG. 18A, the configuration may be a first chain logic block 1110a chaining a first group of event engines 120a, 120b, 120c while a second chain logic block 1110b does not chain any event engines 120. Event engine 120d may or may not be executing. Tables 1850–1870 of FIG. 18B illustrate the chain output signals 1125 that chain logic blocks 1110a and 1110b may output to event engines 120a–20d. As table 1850 shows, chain logic block 1110a may output to event engines 120a–120c the result of the Boolean expression for which it was configured to perform. It outputs a "1" to event engine 120d. Chain logic block 1110b outputs a "1" to event engines 120a–120d. In this fashion, chain logic block 1110b may have no effect on the event engines 120a–120d.

Referring again to FIG. 18A and now to time 2, the execution scheme may be the first and second chain logic blocks 1110*a*, 1110*b* chaining separate groups of event engines 120 (e.g., chain logic block 1110*a* chains event engines 120*a* and 120*b*, while chain logic block 1110*b* chains event engines 120*c* and 120*d*). Referring to table 1860 of FIG. 18B, chain logic block 1110*a* may output to event engines 120*a* and 120*b* a chain logic signal 1125 that may be equal to the Boolean expression (BE) it is configured to form at that time. Chain logic block 1110*b* may output to event engines 120*c* and 120*d* a chain logic signal 1125 that may be equal to the Boolean expression it is configured to form at that time. The chain logic blocks 1110*a* and 1110 *b* output a "1" to other event engines 120 at this time.

Referring again to FIG. 18A, still another possibility is that neither the first nor the second chain logic block 1110*a*, 1110*b* chain the execution any of the event engines 120. For example, time 3 illustrates such a configuration, in which one or more of event engines 120*a*–120*d* are executing independently. Referring again to FIG. 18B, both chain logic blocks 1110*a*, 1110*b* may output chain logic signals 1125 of "1" to all event engines 120 at this time.

Another way of stating the execution scheme of the event engines 120 is that the chain logic blocks 1110 either configure the execution scheme of the event engines 120 to execute independently (e.g., as in time 3 of FIG. 18A) or the chain logic blocks 1110 configure at least two of the event engines 120 to execute together in a chain (e.g., as in times 1 and 2). When the execution scheme chains event engines 120, multitudes of possibilities exist. The states illustrated in FIG. 18A are not necessarily the states that each chain logic block 1110 and event engine 120 is presently in. Generally, not all event engines 120 and chain logic blocks 1110 will be in the same state. For example, during time 1 of FIG. 18, event engine 120*d* may be going through numerous states independently while event engines 120*a*–120*c* stay in their initial state until their condition is satisfied.

Embodiments of the present invention are well suited to other ratios of chain logic blocks 1110 to event engines 120 than a 1:2 ratio. Furthermore, embodiments may have many more then four event engines 120 and many more than two chain logic blocks 1110.

Figure 19:
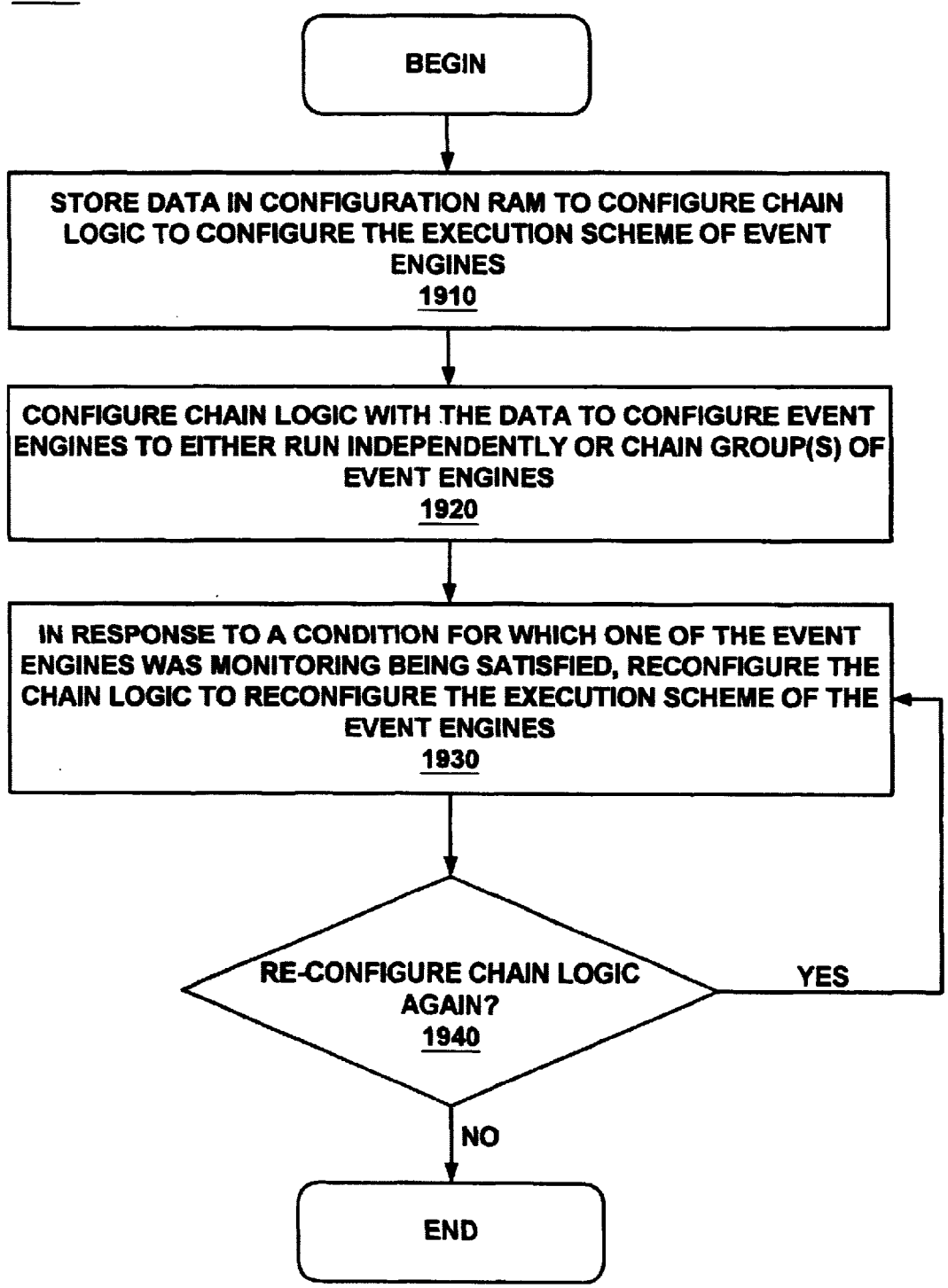
FIG. 19 is a flowchart illustrating a process of configuring event architecture, according to embodiments of the present invention.

Referring now to Process 1900 of FIG. 19, an embodiment that provides a method of configuring event architecture 1700 will be described. In step 1910, data may be stored in the configuration RAM 110. The data to configure the chain logic 1710 may be formatted as illustrated FIG. 12, for example. The configuration of the chain logic 1710 may create the execution scheme (e.g., how the event engines 210 are chained, if at all). Thus, there may be a block in the configuration RAM 110 for each chain logic block 1110 for each state for which a given chain logic block 1110 is to be configured. The configuration RAM 110 may also be loaded with data such as illustrated in FIG. 6 or FIG. 9 to configure the execution of the event engines 210. The configuration of the event engines 210 may cause the event engines 210 to monitor for various conditions.

In step 1920, the chain logic 1710 may be configured with data from the configuration RAM 110 to configure the execution scheme of the event engines 120. The event engines 120 may be configured to execute independently or event engines 120 may be grouped into one or more chains. The event engines 120 may also be configured with data from the configuration RAM 110. The event engines 120 execute according to how they are configured to monitor conditions. As they detect conditions, they may output hit signals 325 and event engines 120 that are executing independently may proceed to further states, in which case they may be re-configured by additional data (e.g., a data block shown in FIG. 6 or FIG. 9) from the configuration RAM 110. However, this will not necessarily cause the configuration of the execution scheme of the event engines 120 to be altered. For example, event engines that were executing independently may continue to execute independently and those whose execution was chained may continue to execute in chained fashion.

In step 1930, the chain logic 1710 may be re-configured to implement a new execution scheme of the event engines 120, in response to one of the event engines 120 determining that a condition for which it was monitoring being satisfied. The event engine 120 may be one that whose execution was chained to another event engine 120. The re-configured execution scheme may take a number of forms. For example, if the original execution scheme had event engines 120 executing as a first chain, the re-configuration may be that at least one event engine 120 that constituted the first chain is to execute independently. In this case, the other event engines 120 in the first chain may form another chain, stop executing, execute independently, etc. Event engines 120 from the first chain forming a new chain may do so with only members of the first chain or with event engines 120 that were not part of the first chain.

The event engines 210 themselves may be re-configured as illustrated in steps 530–550 of FIG. 5 while the chain logic 1710 remains in the same configuration (e.g., while the execution scheme remains unchanged). Process 1900 may re-configure the execution scheme of the event engines 120 any number of times and in any fashion, as reflected in step 1940 by repeating step 1930. Eventually process 1900 may end when, for example, the chain logic 1710 does not need to be re-configured any more, based on data stored in the configuration RAM 110.

Figure 20:
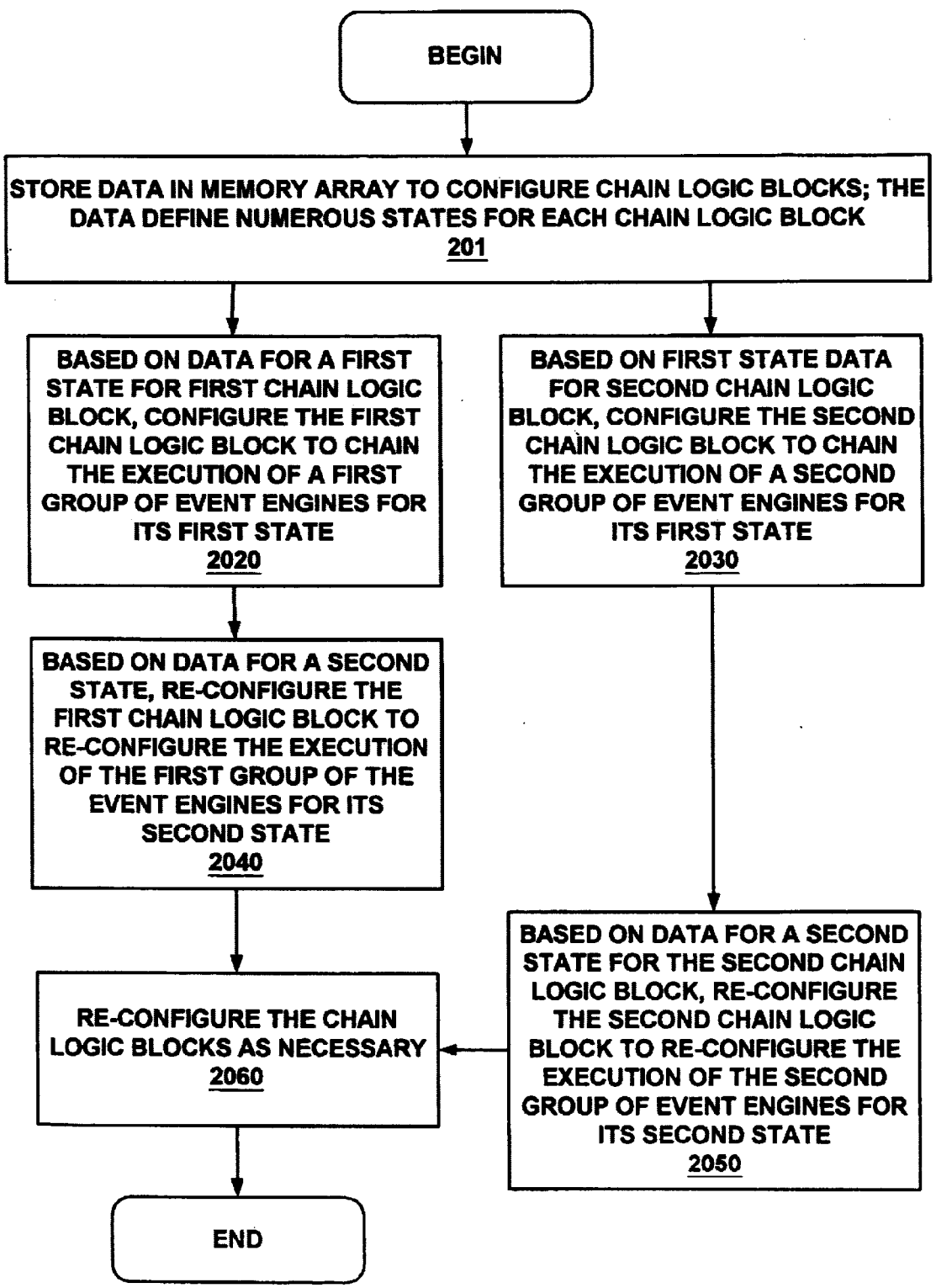
FIG. 20 is a flowchart illustrating a process of configuring event architecture, according to embodiments of the present invention.

FIG. 20 illustrates another embodiment for configuring event architecture 1700. In step 2010 of Process 2000, data may be stored in the configuration RAM 110. The data may comprise a block (e.g., as illustrated in FIG. 12) for each state for each chain logic block 1110. Not all chain logic blocks 1110 need to be used at the same time. An unused chain logic block 1110 may be configured to have no effect on the event engines 120.

In step 2020, a first chain or combinational logic 1110 may be configured to chain the execution of a first group of event engines 120 for the first state for this chain logic block 1110. The first state data for the first chain logic block 1110 may be for configuring the first chain logic block 1110 to output the result of a Boolean expression formed from input signals 325 from selected event engines 120. Therefore, step 2020 may further comprise configuring the first chain logic block 1110 to output the result of a first Boolean expression for the first state.

In step 2030, a second chain logic block 1110 may be configured to chain the execution of a second group of event engines 120 for the first state for the second chain logic block 1110. Steps 2020 and 2030 may be undertaken essentially simultaneously. The execution scheme may have other event engines 120 executing independent of the two chains described in step 2020 and 2030. Step 2030 may further comprise configuring the second chain logic block 1110 to output the result of a second Boolean expression for the first state.

Step 2030 may further comprise outputting the result of the first and second Boolean expression from the first and second combinational logics 1110 to the first and second groups of event engines 120, wherein the first group of event engines 120 are chained by the first Boolean expression and the second group of event engines 120 are chained by the second Boolean expression.

In step 2040, the first chain logic block 1110 is re-configured to, in turn, re-configure the execution scheme of the first group of the event engines 210. This may be termed a second state of the first chain logic block 1110. The reconfiguration of the first group of event engines 120 may comprise: re-configuring at least one event engine 120 of the first group to run independently, forming a third chain comprising at least one event engine 120 from the first event engines 120 and at least on event engine 120 that is not one of the first event engines 120, etc.

Step 2040 may further comprise re-configuring the first combinational logic 1110 to output the result of a third Boolean expression for its second state. Step 1940 may further comprise outputting the result of the third Boolean expression to the third group of event engines 120, wherein the third group of event engines 120 is chained by the third Boolean expression. It is also possible that multiple combinational logics 1110 are re-configured at this time. However, it is not required that more than one chain logic block 1110 be re-configured at a time. In this fashion, the chain logic blocks 1110 do not necessarily step through their states in lock-step. However, embodiments do allow for lock-step operation.

In step 2050, the second chain logic block 1110 may be re-configured to alter the execution scheme. For example it may alter the way the second group of event engines 210 are chained. This may be termed a second state of the second chain logic block 1110. The re-configuration of the second group of event engines 120 may comprise: re-configuring the second combinational logic 1110 to chain the execution of a fourth group of the event engines 210 for the second state, wherein the fourth group comprises a different set of event engines 210 than the second group; re-configuring the second combinational logic 1110 to not chain the execution of any group of the event engines 210 for the second state, wherein only the first combinational logic 1110 chains the execution of the event engines 210; re-configuring the first and second combinational logics 1110 to not chain the execution of any group of the event engines 210 for the second state, wherein the event engines 210 execute independently, etc.

Each combinational logic 1110 may be re-configured as often as desired, as represented by step 2060. When no more reconfigurations are needed, as defined by the data in the configuration RAM 110, the process 2000 may end. Process 2000 may be modified to provide for additional combinational logics 1110.

External Interface to Event Architecture

Embodiments of the present invention provide external pins to a device that comprises the event architecture 1700, such that the event engines 120 may detect events external to the device. In addition, embodiments may be able to detect events that may be termed to occur within a device that houses the event architecture 1700. Furthermore, embodiments provide one or more external output pins, such that the event engines 120 may output signal(s) in response to events being detected. These events may be either internal or external to the device housing the event architecture 1700.

Figure 21:
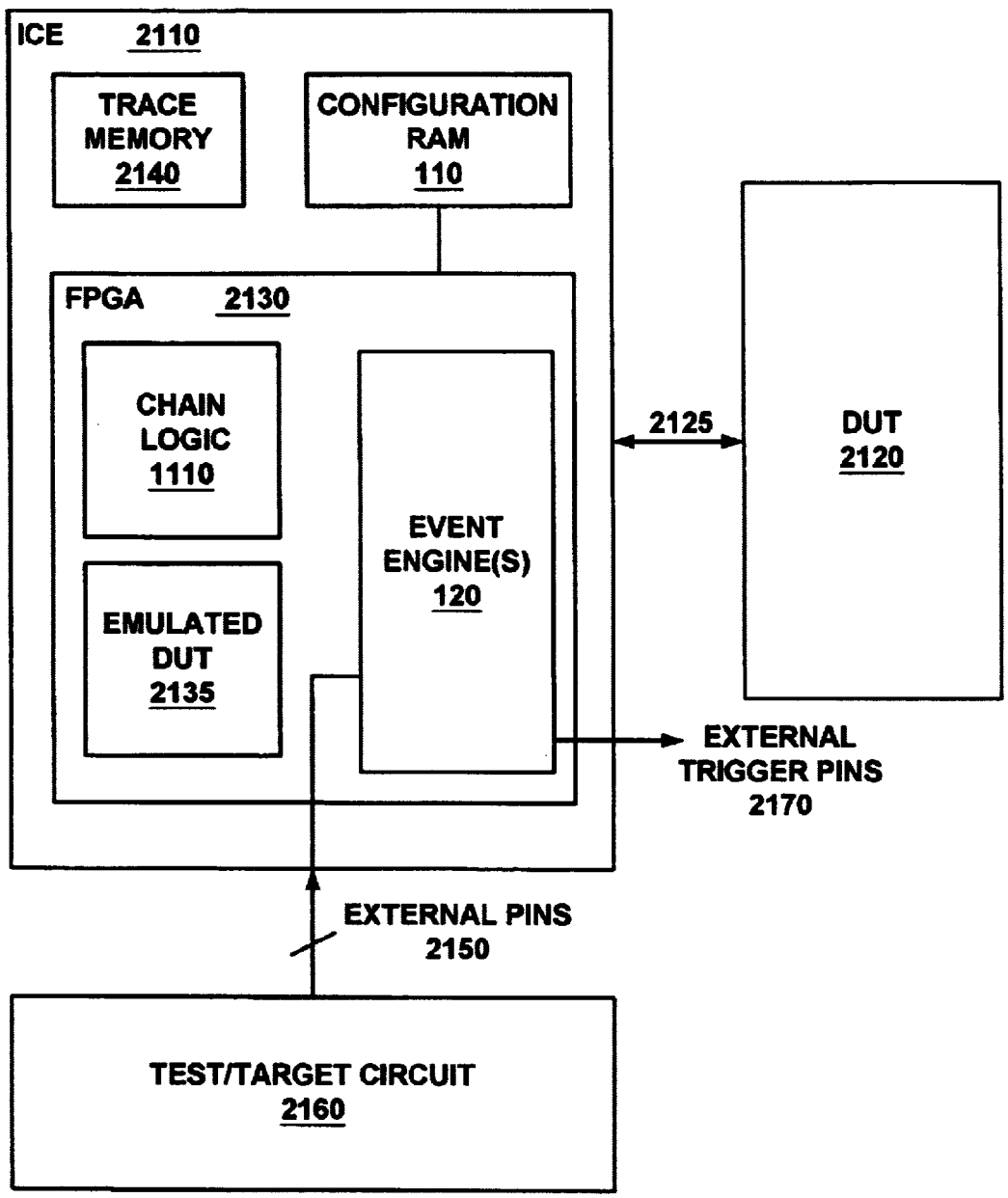
FIG. 21 is a block diagram illustrating an in-circuit emulator coupled to other devices, according to embodiments of the present invention.

FIG. 21 illustrates an embodiment in which the event architecture 1700 resides in an in-circuit emulator (ICE) 2110. The system 2100 of FIG. 21 comprises an ICE 2110, which may be able to emulate a device under test 2120. The device under test 2120 may be a microcontroller; however, the present invention is not limited to testing microcontrollers. For example, the device under test 2120 may be a digital signal processor or another device. Thus, the ICE 2110 may emulate a microcontroller, with which it may interface via interface 2125. However, the present invention is not limited to emulating microcontrollers. The ICE 2110 may implement an emulated version 2135 of the device under test 2120 in the Field Programmable Gate Array (FPGA) 2130; however, the present invention is not limited to emulating the device under test 2120 in an FPGA 2130. The Verilog™ description language may be used to facilitate the implementation.

Using an example in which the device under test 2120 is a microcontroller, the FPGA 2130 may emulate core processor functionality of the microcontroller, such as, for example, microprocessor functions, Arithmetic Logic Unit functions, and RAM and ROM functions. However, the present invention is not limited to emulating core processor functions. The emulated device under test (DUT) 2135 may operate substantially analogously to the microcontroller or other DUT 2120. Emulating the microcontroller in the ICE 2110 may provide significant advantages, such as, for example, providing debugging tools, which may include readout of registers and memory locations, for example. Thus, the amount of debugging support that is built into the device under test 2120 (e.g., a microcontroller) may be minimized. However, information may be passed between the ICE 2110 and the microcontroller via interface 2125, for example, I/O read information, interrupt vectors, etc. may be passed over interface 2125 to the ICE 2110.

A device that provides an in-circuit emulator 2110 is described in co-pending U.S. patent application Ser. No. 09/975,030, filed Oct. 10, 2001, entitled "EMULATOR CHIP/BOARD ARCHITECTURE AND INTERFACE," by Snyder et al., attorney docket number CYPR-CD00185 and assigned to the assignee of the present invention, which is hereby incorporated by reference.

The FPGA 2130 may also comprise portions of the event architecture 1700. For example, the chain logic 1110 and the event engines 120 may reside in the FPGA 2130. The configuration RAM 110, which may also form a portion of the event architecture 1700, may reside in the ICE 2110 and be coupled to the FPGA 2130. The ICE 2110 may further comprise trace memory 2140, which may store information when the trace is on.

Still referring to FIG. 21, the ICE 2110 may have a number of external pins 2150 that may allow it to receive signals from an external device. The external pins 2150 may couple to the event engines 120 such that external events may be monitored. For example, in FIG. 21, the external pins 2150 may be coupled to a test/target circuit or circuit under test 2160. For example, the circuit under test 2160 may be a motor controller; however, this example is not limiting. The external pins 2150 may be used to monitor signals from the circuit under test 2160. Thus, in one embodiment, the external pins 2150 may function analogously to logic channels on a logic analyzer. However, unlike a conventional logic analyzer, embodiments of the present invention may react on a state-by-state basis to external events and change the configuration of the event engines 120 not only to look for different events on the external pins 2150, but also to look for different events that occur inside the ICE 2110. In another embodiment, the circuit under test 2160 may be replaced by a logic analyzer board.

In one embodiment, the signals on the external logic pins 2150 are automatically fed into the trace memory 2140 of the ICE 2110. Therefore, the state of events external to the ICE 2110 may be correlated to the state of events inside the ICE 2110. For example, the state of a device or circuit outside (e.g., circuit under test 2160) the ICE 2110 may be correlated to a portion of the code running when external events trigger.

Still referring to FIG. 21, the ICE 2110 may also include an external trigger pin 2170, which may be fed the output signal 115*a* from the external trigger logic 820 shown in FIG. 7. The ICE 2110 may have multiple external trigger pins 2170. Thus, one or more external devices may be controlled in response to the detection of events being monitored. For example, an event engine 120 may monitor for the program counter being in a certain range, and in response to the detection of that event, outputting a signal 115*a*, which may trigger an oscilloscope to capture data related to a circuit or device under test. While the external interface pins 2150, 2170 have been described as input or output pins, it will be clear to those of ordinary skill in the art that a pin may serve as both input and output.

By being able to monitor both internal events and external events, as well as being able to emulate a device under test 2120 and control devices with external trigger signal(s), embodiments of the present invention are able to provide the functionality of both an ICE 2110 and a logic analyzer. However, the example illustrated in FIG. 21, in which the device comprising event architecture 1700 with external interfaces is an ICE 2110, is not limiting. Embodiments of the present invention are well suited to other devices with external interfaces hosting the event architecture 1700. Furthermore, coupling the external pins 2150 to a circuit under test 2160 is not limiting; embodiments of the present invention are well suited to receiving signals from other devices via the external pins 2150.

Referring again to the embodiment illustrated in FIG. 4, the multiplexer 410 receives a number of signals 105, some of which may originate from within the device that houses the event architecture 1700 (e.g., the program counter, accumulator, etc.). However, the multiplexer 410 may also receive signals 105 that originate from outside the device that houses the event architecture 1700. For example, external logic pin signals 415 may originate from outside the device and may be received by the physical external pins 2150. Furthermore, some signals 105 may originate from the device under test 2120, such as a microcontroller. For example, I/O signals may originate from a microcontroller, although the present invention is not so limited. As discussed herein, the multiplexer 410 may be used to select which signals 105 are to be monitored for the occurrence of events or for conditions being satisfied.

Figure 22:
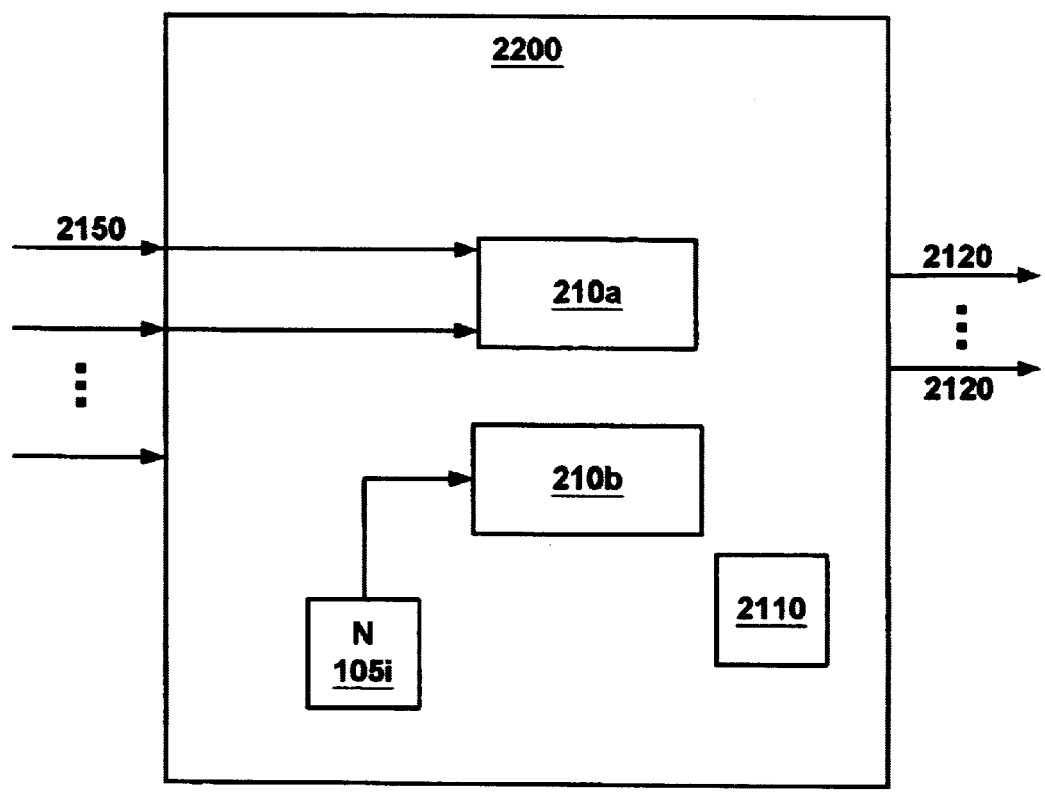
FIG. 22 is a block diagram illustrating a device having event engines, external input pins, and external output pins, according to embodiments of the present invention.
Figure 23:
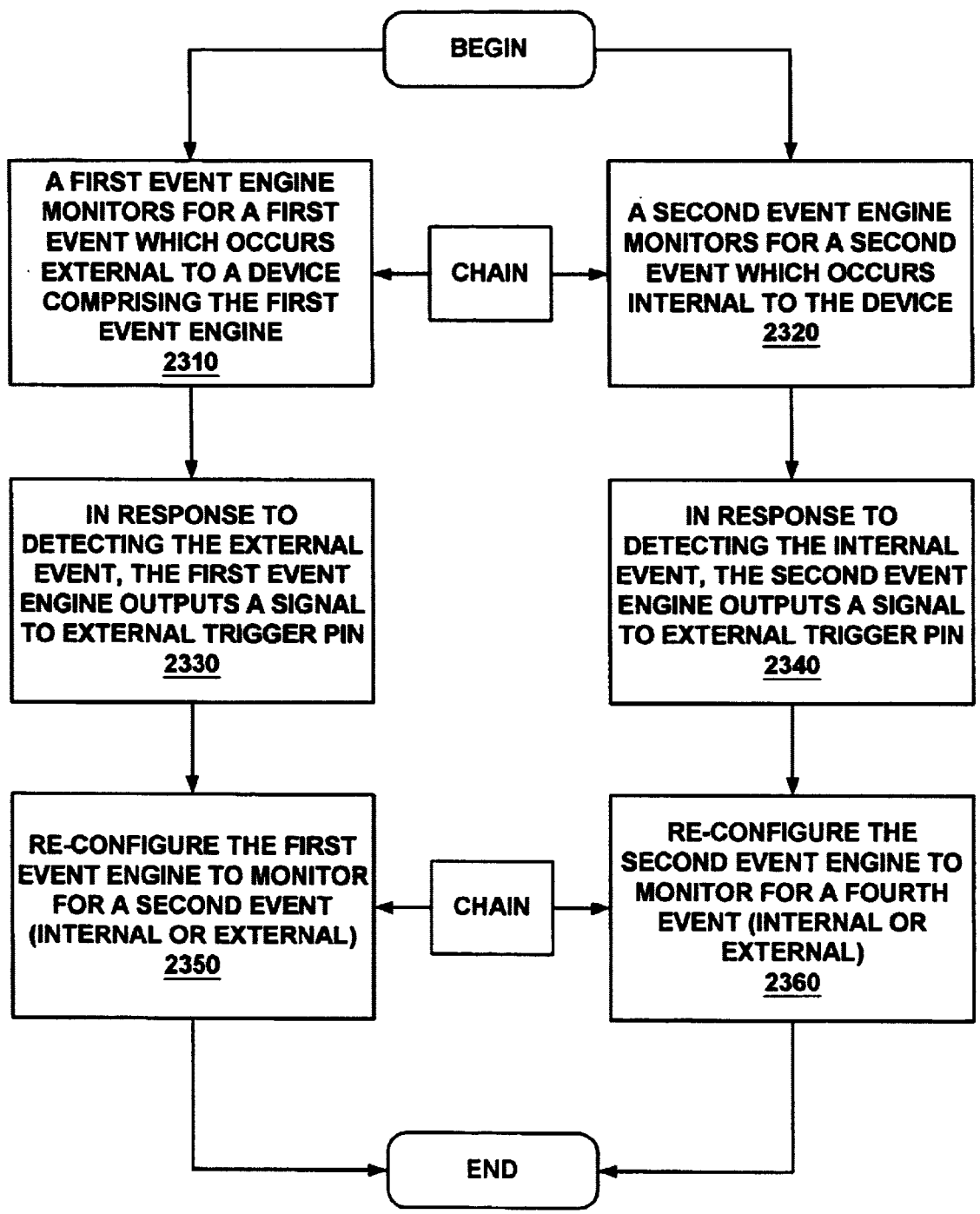
FIG. 23 is a flowchart illustrating steps of a process of monitoring events, according to embodiments of the present invention.

As discussed herein, the device housing the event architecture 1700 may have any number of external interface pins 2150, 2170 and may monitor both internal and external events. By internal events, it may be meant that the events are related to the operation of the emulated DUT 2135 in the FPGA 2310. By external events, it may be meant that the events relate to information received on external interface pins 2150. However, the present invention is not limited to monitoring only such events. For example, the ICE 2110 may receive information from the device under test 2120 (e.g., a microcontroller) via interface 2125. The block diagram of FIG. 22 and the Process 2300 of FIG. 23 will now be discussed. In step 2310, a first event engine 210*a* monitors for a first event that occurs external to a device 2200 comprising the first event engine 210*a*. The event engine 210*a* may select one or more external logic pins 2150 as discussed herein.

In step 2320, a second event engine 210*b* monitors for a second event that occurs internal to the device 2200, which also comprises the second event engine 210*b*. In so doing, the second event engine 210*b* may select a signal 115, such as, for example, the value of the program counter (see, e.g., FIG. 4, FIG. 6, FIG. 9, and their associated descriptions). The second event engine may also receive the information relating to the program counter from a microcontroller under test via the interface 2125. The execution of the first and second event engines 210*a*, 210*b* may be chained by one or more chain logic blocks 1110 as discussed herein; however, they may also execute independently.

The device housing the event engines 210 may also be performing emulation. For example, the ICE 2110 may be emulating a device under test 2120. In this case, the signal 105 that is input to the event engine 210 may be a signal 105 related to the emulated DUT 2135. However, the signal 105 may also originate from an actual DUT 2120, for example a microcontroller.

In step 2330, the first event engine 210*a* may output a trigger signal(s) 115*a* on one or more of the external trigger pins 2170, in response to the external event for which it was monitoring being detected.

In optional step 2340, the second event engine 210*b* may output a trigger signal(s) 115*a* on one or more of the external trigger pins 2170, in response to the internal event for which it was monitoring being detected. Thus, trigger signals 115*a* may be issued based on internal or external events. Also, the device 2200 housing the event architecture may have any number of external trigger pins 2170.

In step 2350, the first event engine 210*a* may be re-configured to monitor for a third event, which may be an internal or an external event. Thus, the first event engine 210*a* may input any of the internal signals 105*i* or any of the signals from the external logic pins 2150.

In step 2360, the second event engine 210*a* may be re-configured to monitor for a fourth event, which may be an internal or an external event. Thus, the second event engine 210*b* may input any of the internal signals 105*i* or any of the signals from the external logic pins 2150. Process 2300 may then end. Additional steps may be inserted in Process 2300 such as, for example, steps for monitoring for additional events, etc.

Process 2300 may be modified to execute only selected steps thereof, such as, for example, not performing step 2310 of monitoring for external events. Thus, embodiments provide for a process in which an event engine 210 outputs an signal 115*a* on an external trigger pin 2170, in response to internal events only, as illustrated in steps 2320 and 2340.

The preferred embodiment of the present invention, a device and method for implementing an event engine, is thus described. While the present invention has been described in particular embodiments, it should be appreciated that the present invention should not be construed as limited by such embodiments, but rather construed according to the below claims.

What is claimed is:

1. A device for executing an event thread comprising:
   programmable logic for storing data to define a plurality of states in an event thread to be executed in said device, said plurality of states comprising a current state and a next state;
   execution logic coupled to said programmable logic and configurable to execute the current state and re-configurable to execute the next state in response to data from said programmable logic; and transition logic coupled to said programmable logic and for causing said next state to be entered by loading new data from said programmable logic, wherein said execution logic is re-configurable during execution of said event thread.

2. The device of claim 1, wherein said execution logic comprises:

input logic coupled to said programmable logic and configurable to select between a plurality of inputs in response to said data from said programmable logic, and said input logic further operable to be reconfigured by data from said programmable logic.

3. The device of claim 2, wherein said execution logic further comprises:

determination logic coupled to said programmable logic and configurable by said programmable logic to detect a condition with respect to said selected input and to issue a trigger signal upon said condition being detected, said determination logic further operable to be re-configured to detect a new condition during said next state.

4. The device of claim 1, wherein said execution logic further comprises:

determination logic coupled to said programmable logic and configurable by said programmable logic to detect a condition with respect to an input to said execution logic and to issue a trigger signal upon said condition being detected, wherein said determination logic is operable to be re-configured to execute said next state.

5. The device of claim 4, wherein said execution logic further comprises:

an output coupled to said programmable logic and to said determination logic, said output configurable by data from said programmable logic as to which signals, if any, of a plurality of signals it is to output upon receiving said trigger signal.

6. The device of claim 1, wherein said execution logic further comprises:

an output coupled to said programmable logic and configurable by data from said programmable logic to select between a plurality of signals in response to a condition defined by data from said programmable logic being met.

7. A method of executing an event thread, said method comprising:

a) receiving data defining said event thread comprising a plurality of states;

b) storing said data in a memory array in a thread engine;

c) configuring logic in said thread engine to execute a first state of said event thread by using first data from said memory array;

d) executing said first state in said event thread by said logic;

e) re-configuring said logic to execute a second state by using second data from said memory array;

f) executing said second state using said re-configured logic; and g) repeating e) and f) to execute further states of said event thread, wherein said event thread is executed.

8. The method of claim 7, wherein:

c) comprises configuring input logic to select a first of a plurality of inputs to said thread engine; and e) comprises re-configuring said input logic to select a second of said plurality of inputs to said thread engine.

9. The method of claim 8, wherein:

c) further comprises configuring determination logic to detect a first condition with respect to said first selected input; and e) further comprises re-configuring said determination logic to detect a second condition with respect to said second selected input.

10. The method of claim 8, wherein:

c) further comprises configuring output logic to output a first specified signal in response to a condition being detected; and e) further comprises re-configuring said output logic to output a second specified signal in response to said condition being detected.

11. The method of claim 10, wherein:

c) further comprises configuring determination logic to determine if said first selected input meets a first condition; and e) further comprises re-configuring said determination logic to determine if said second selected input meets a second condition.

12. The method of claim 7, wherein:

c) comprises configuring determination logic to determine if a selected input meets a first condition; and e) comprises re-configuring said determination logic to determine if said selected input meets a second condition.

13. The method of claim 12 wherein:

c) further comprises configuring output logic to select between a plurality of signals in response to said first condition being detected; and e) further comprises re-configuring said output logic to select between a plurality of signals in response to said second condition being detected.

14. The method of claim 7 wherein:

c) comprises configuring output logic to output a first specified signal in response to a condition being detected; and e) comprises re-configuring said output logic to output a second specified signal in response to said condition being detected.

15. A device for implementing a programmable event engine, said device comprising:

a memory array for storing data to define a plurality of states in an event thread;

an input coupled to said memory array and configurable in response to said data from said memory array to select one of a plurality of inputs;

detection logic coupled to said memory array and configurable by said data from said memory array to determine if said selected input satisfies a condition and, if so, to issue a trigger signal;

an output coupled to said memory array and configurable in response to said data from said memory array to output at least one selected signal, if any signal is selected, when receiving said trigger signal;

said detection logic, said input, and said output for executing the current state of said plurality and to be reconfigured in response to data from said memory array to execute a next state of said plurality; and transition logic coupled to said memory array and for causing said next state to be entered by loading new data from said memory array.

16. The device of claim 15, wherein said detection logic comprises:

comparator logic coupled to said input and for determining when an input condition is within a range of values.

17. The device of claim 15, wherein said data defines what input is to be selected for monitoring.

18. The device of claim 15, wherein said data defines what condition is being tested for.

19. The device of claim 15, wherein said data comprises information to control what action to take upon said condition being satisfied.

20. The device of claim 15, wherein said input comprises a programmable multiplexer.

\* \* \* \* \*